United States Patent
Uchida et al.

(10) Patent No.: US 11,773,477 B2
(45) Date of Patent: Oct. 3, 2023

(54) DEPOSITION MASK

(71) Applicant: Dai Nippon Printing Co., Ltd., Tokyo (JP)

(72) Inventors: Yasuhiro Uchida, Tokyo (JP); Koji Kobayashi, Tokyo (JP); Hiromitsu Ochiai, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 455 days.

(21) Appl. No.: 16/726,996

(22) Filed: Dec. 26, 2019

(65) Prior Publication Data

US 2020/0199733 A1 Jun. 25, 2020

(30) Foreign Application Priority Data

Dec. 25, 2018 (JP) ................................. 2018-241594
Dec. 25, 2019 (JP) ................................. 2019-233978

(51) Int. Cl.
*C23C 14/04* (2006.01)
*H10K 71/00* (2023.01)
(Continued)

(52) U.S. Cl.
CPC ........... *C23C 14/042* (2013.01); *H10K 71/00* (2023.02); *H10K 71/166* (2023.02); *H10K 50/11* (2023.02); *H10K 71/164* (2023.02)

(58) Field of Classification Search
CPC ......... C23C 14/042; C23C 8/04; C23C 10/04; C23C 14/04; C23C 14/044; C23C 16/04;
(Continued)

(56) References Cited

U.S. PATENT DOCUMENTS

2010/0267227 A1* 10/2010 Ko .......................... B05C 11/00
156/60
2011/0067630 A1* 3/2011 Ko ......................... B05C 21/005
118/721
(Continued)

FOREIGN PATENT DOCUMENTS

CN 103668056 A 3/2014
CN 103695842 A 4/2014
(Continued)

OTHER PUBLICATIONS

Extended European Search Report (Application No. 19219714.3) dated May 28, 2020.
(Continued)

*Primary Examiner* — Aiden Lee
(74) *Attorney, Agent, or Firm* — BURR PATENT LAW, PLLC

(57) ABSTRACT

A deposition mask includes: a mask body having two or more first through-holes; and a support disposed on the mask body and having a second through-hole located at a position overlapped with the first through-holes in a plan view. The mask body has a first surface located on an opposite side of a side of the support, and a second surface located on the side of the support. An outermost circumference first through-hole, which is located on an outermost circumference in a plan view of the two or more first through-holes located at the position overlapped with the second through-hole in a plan view, includes a first point which is a center of the outermost circumference first through-hole in a plan view; the second through-hole includes a second point on an outline of the second through-hole, the second point being nearest to the first point.

14 Claims, 13 Drawing Sheets

(51) Int. Cl.
 *H10K 71/16* (2023.01)
 *H10K 50/11* (2023.01)

(58) Field of Classification Search
 CPC .... C23C 16/042; C23C 18/06; H10K 71/166; C30B 25/04
 USPC .................................................. 118/720–721
 See application file for complete search history.

(56) References Cited

U.S. PATENT DOCUMENTS

| | | | |
|---|---|---|---|
| 2013/0133573 A1* | 5/2013 | Joo | ........................ C23C 14/042 118/504 |
| 2015/0037928 A1 | 2/2015 | Hirobe et al. | |
| 2016/0293844 A1 | 10/2016 | Takeda et al. | |
| 2018/0040857 A1 | 2/2018 | Hong et al. | |
| 2018/0053894 A1 | 2/2018 | Miyadera et al. | |
| 2018/0287064 A1* | 10/2018 | Matsueda | ............... H10K 71/00 |
| 2019/0106781 A1* | 4/2019 | Sakio | ........................ C23C 14/042 |
| 2020/0044010 A1* | 2/2020 | Ju | ........................... H10K 71/00 |
| 2020/0165714 A1 | 5/2020 | Nishida et al. | |
| 2020/0190655 A1 | 6/2020 | Zhu et al. | |

FOREIGN PATENT DOCUMENTS

| | | |
|---|---|---|
| CN | 105637113 A | 6/2016 |
| CN | 105951040 A | 9/2016 |
| CN | 108004504 A | 5/2018 |
| CN | 108796434 A | 11/2018 |
| JP | S57-26163 A | 2/1982 |
| JP | 2013-163864 A | 8/2013 |
| JP | 2015-117432 A | 6/2015 |
| JP | 2016-145420 A | 8/2016 |
| JP | 5994952 B2 | 9/2016 |
| JP | 2018-026344 A1 | 2/2018 |
| WO | 2017/110123 A1 | 6/2017 |

OTHER PUBLICATIONS

Chinese Office Action (with English translation) dated Jun. 29, 2022 (Application No. 201911353542.6).
Taiwanese Office Action (Application No. 108147583) dated Sep. 5, 2022 (with English translation).
Chinese Office Action (with English translation) dated Jan. 20, 2023 (Application No. 201911353542.6).
Chinese Office Action (with English translation) dated Oct. 10, 2022 (Application No. 201911353542.6).
Japanese Office Action (with English translation) dated Jul. 14, 2023 (Application No. 2019-233978).

* cited by examiner

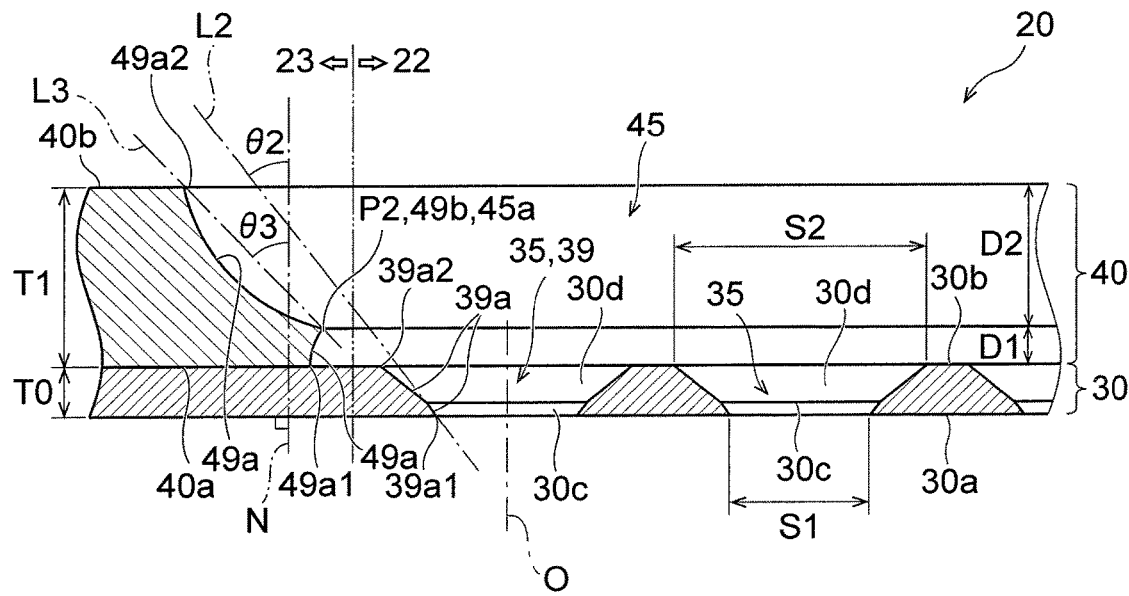
FIG. 16    SECOND SIDE ⟵⟶ FIRST SIDE
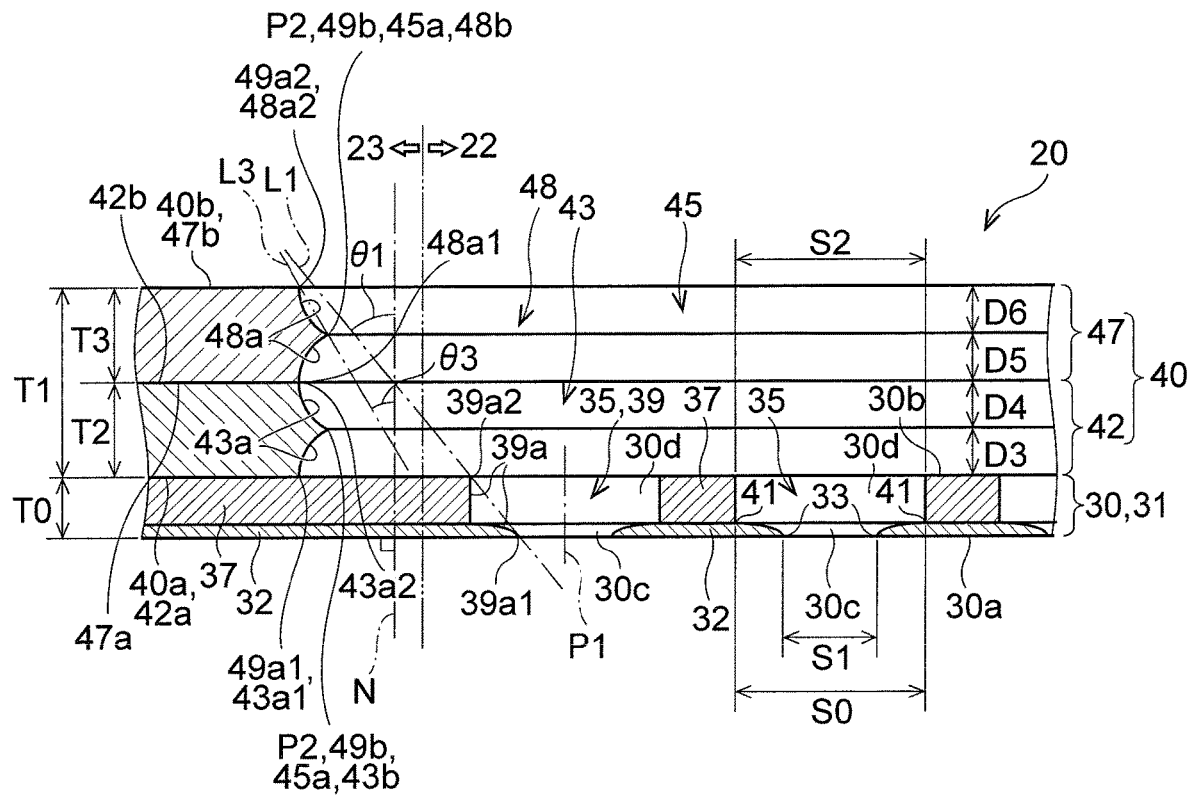
FIG. 17    SECOND SIDE ⟵⟶ FIRST SIDE

DEPOSITION MASK

CROSS-REFERENCE TO RELATED APPLICATIONS

This application is based on and claims the benefit of priority from Japanese Patent Application Nos. 2018-241594 and 2019-233978 filed Dec. 25, 2018 and Dec. 25, 2019, respectively, the contents of which are hereby incorporated by reference in its entirety.

TECHNICAL FIELD

The present disclosure relates to a deposition mask.

BACKGROUND ART

A display device used in a portable device such as a smart phone and a tablet PC is required to have high fineness.

An organic EL display device draws attention because of its excellent responsibility, low power consumption and excellent contrast. A known method for forming pixels of an organic EL display device is a method which uses a deposition mask including through-holes that are arranged in a desired pattern, and forms pixels in the desired pattern. To be specific, a substrate to be deposited (a substrate for an organic EL display device) is firstly put into a deposition apparatus. Then, a deposition step in which a deposition mask is brought into contact with the substrate for organic EL so as to deposit an organic material onto the substrate for organic EL is carried out in the deposition apparatus.

An example of such a deposition mask may be a mask assembly disclosed in JP2018-26344A. The mask assembly disclosed in JP2018-26344A comprises a mask sheet having two or more openings defining through-holes.

In a deposition step in which a deposition material is deposited onto a substrate to be deposited, the deposition material flying toward a deposition mask passes through through-holes and adheres to the substrate to be deposited. In this case, the deposition material, which moves toward the substrate to be deposited, moves not only along a normal direction of the deposition mask, but also moves along a direction inclined with respect to the normal direction of the deposition mask. Even in this case, generation of shadow, i.e., a phenomenon in which the movement of the deposition material in the direction inclined with respect to the deposition mask is held up, so that the deposition material cannot appropriately reach the substrate to be deposited, is required to be prevented.

SUMMARY

The present disclosure has been made in view of the above point. The object of the present disclosure is to provide a deposition mask capable of preventing generation of shadow.

A deposition mask of the present disclosure comprises:
a mask body having two or more first through-holes; and
a support disposed on the mask body and having a second through-hole located at a position overlapped with the first through-holes in a plan view;
wherein:
the mask body has a first surface located on an opposite side of a side of the support, and a second surface located on the side of the support;
an outermost circumference first through-hole, which is located on an outermost circumference in a plan view of the two or more first through-holes located at the position overlapped with the second through-hole in a plan view, includes a first point which is a center of the outermost circumference first through-hole in a plan view;
the second through-hole includes a second point on an outline of the second through-hole, the second point being nearest to the first point;
the outermost circumference first through-hole has a first wall which is a wall on a side of the second point, in a first cross-section that is a plane which includes the first point and the second point and is parallel to a normal direction of the mask body;
the outermost circumference first through-hole has a second surface side connection part which connects the first wall and the second surface, in the first cross-section; and
the support is located on a second side which is an opposite side of a first side which is a center side of the second through-hole in the first cross-section in a plane direction of the support, with respect to a straight line of straight lines passing the second surface side connection part and a given point on the first wall in the first cross-section, the straight line having a largest angle with respect to the normal direction of the mask body.

According to the present disclosure, a deposition mask capable of preventing generation of shadow can be provided.

BRIEF DESCRIPTION OF THE DRAWINGS

FIG. 16 is a view for describing a second embodiment of the present disclosure, which is a cross-sectional view showing a deposition mask.

FIG. 17 is a cross-sectional view showing another modification example of the deposition mask.

DESCRIPTION OF EMBODIMENTS

Figure 1:
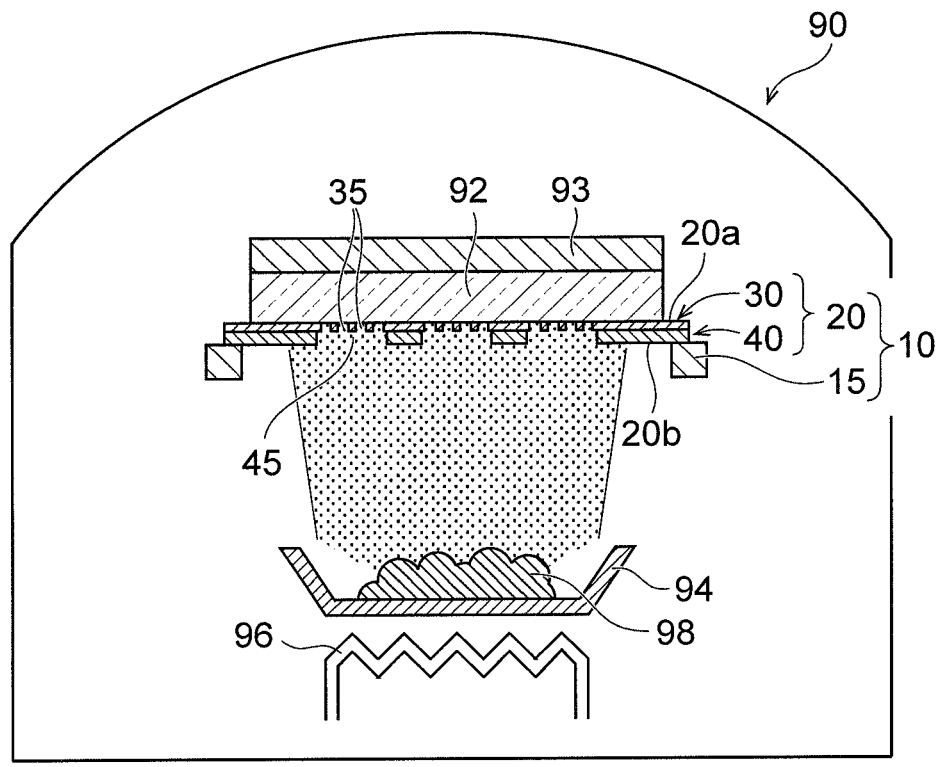
FIG. 1 is a view for describing a first embodiment of the present disclosure, and for describing a deposition apparatus having a deposition mask apparatus.

In the specification and the drawings, unless otherwise specified, the terms that mean a material on the basis of structures, such as "substrate", "base plate", "plate", "sheet" and "film", are not differentiated from one another, based only on the difference in terms.

In the specification and the drawings, unless otherwise specified, the terms used herein specifying shapes, geometric conditions, physical properties, and their degrees, e.g., "parallel," "orthogonal" etc., and values of lengths and angles as well as physical properties are not limited to their strict definitions, but construed to include a range capable of exerting a similar function.

In the specification and the drawings, unless otherwise specified, when a certain structure such as a certain member or a certain area is "above (or below)" or "on the upside (or on the downside)" of another structure such as another member or another area, it includes not only a case in which the certain structure is in direct contact with the other structure, but also a case in which a further structure is disposed between the certain structure and the other structure. In addition, unless otherwise specified, the term upper (or upside or above) and the term lower (or downside or below) are used for explanation, but they can be replaced with each other.

In this specification and the drawings, unless otherwise specified, the same or similar reference numeral is given to the same part and parts having the similar function, and repeated description thereof is sometimes omitted. There is a possibility that a scale dimension differs from an actual one, and that a part of a structure is omitted from the drawings, in the convenience of explanation.

In this specification and the drawings, unless otherwise specified, the embodiment of the disclosure can be combined with other embodiments and modifications as long as no contradiction arises. The other embodiments may be combined and the other embodiments and modifications may be combined as long as no contradiction arises. The modifications can also be combined as long as no contradiction arises.

In the specification and the drawing, unless otherwise specified, when two or more steps are disclosed regarding a method such as a manufacturing method, other steps which are not disclosed may be performed between the disclosed steps. The order of the disclosed steps is arbitrary as long as no contradiction arises.

In the specification and the drawings, unless otherwise specified, a numerical range expressed by means of a symbol "-" includes numerical values with the symbol "-" interposed therebetween. For example, a numerical range delimited by the expression "34-38% by mass" is the same as a numerical range delimited by the expression "not less than 34% by mass and not more than 38% by mass".

In the specification and the drawings, unless otherwise specified, in one embodiment of this specification, examples related to a deposition mask used for patterning an organic material on a substrate in a desired pattern, and a manufacturing method of the deposition mask are described. However, the embodiment is not limited to this application, and can be applied to a deposition mask used for various purposes.

An embodiment of the present disclosure is described with reference to the drawings. The below-described embodiments are examples of the embodiment of the present disclosure, and the present disclosure should not be limited to the embodiments.

A first aspect of the present disclosure is a deposition mask comprising:

a mask body having two or more first through-holes; and a support disposed on the mask body and having a second through-hole located at a position overlapped with the first through-holes in a plan view;

wherein:

the mask body has a first surface located on an opposite side of a side of the support, and a second surface located on the side of the support;

an outermost circumference first through-hole, which is located on an outermost circumference in a plan view of the two or more first through-holes located at the position overlapped with the second through-hole in a plan view, includes a first point which is a center of the outermost circumference first through-hole in a plan view;

the second through-hole includes a second point on an outline of the second through-hole, the second point being nearest to the first point;

the outermost circumference first through-hole has a first wall which is a wall on a side of the second point, in a first cross-section that is a plane which includes the first point and the second point and is parallel to a normal direction of the mask body;

the outermost circumference first through-hole has a second surface side connection part which connects the first wall and the second surface, in the first cross-section; and the support is located on a second side which is an opposite side of a first side which is a center side of the second through-hole in the first cross-section in a plane direction of the support, with respect to a straight line of straight lines passing the second surface side connection part and a given point on the first wall in the first cross-section, the straight line having a largest angle with respect to the normal direction of the mask body.

A second aspect of the present disclosure is a deposition mask comprising:

a mask body having two or more first through-holes; and a support disposed on the mask body and having a second through-hole located at a position overlapped with the first through-holes in a plan view;

wherein:

the mask body has a first surface located on an opposite side of a side of the support, and a second surface located on the side of the support;

an outermost circumference first through-hole, which is located on an outermost circumference in a plan view of the two or more first through-holes located at the position overlapped with the second through-hole in a plan view, includes a first point which is a center of the outermost circumference first through-hole in a plan view;

the second through-hole includes a second point on an outline of the second through-hole, the second point being nearest to the first point;

the outermost circumference first through-hole has a first wall which is a wall on a side of the second point, in a first cross-section that is a plane which includes the first point and the second point and is parallel to a normal direction of the mask body;

the outermost circumference first through-hole has a first surface side connection part which connects the first wall and the first surface, in the first cross-section;

the first wall does not have a part nearer to the first point than the first surface side connection part; and the support is located on a second side which is an opposite side of a first side which is a center side of the second through-hole in the first cross-section in a plane direction of the support, with respect to a straight line of straight lines passing the first surface side connection part and a given point on the first wall in the first cross-section, the straight line having a smallest angle with respect to the normal direction of the mask body.

In the respective aforementioned first aspect or the aforementioned second aspect, a third aspect of the present disclosure may be that:

the support has a first surface located on a side of the mask body, and a second surface located on an opposite side of the side of the mask body;

the second through-hole has a second wall nearest to the outermost circumference first through-hole, in the first cross-section;

the second through-hole has a second surface side connection part which connects the second wall and the second surface of the support, in the first cross-section; and in the first cross-section, a largest angle of a straight line passing the second surface side connection part of the second through-hole and a given point on the second wall, with respect to the normal direction of the support, is not less than 20 degrees and not more than 60 degrees.

In the respective aforementioned first aspect to the aforementioned third aspect, a fourth aspect of the present disclosure may be that the support has a thickness not less than 0.05 mm and not more than 3 mm.

In the respective aforementioned first aspect to the aforementioned fourth aspect, a fifth aspect of the present disclosure may be that the mask body contains metal.

In the respective aforementioned first aspect to the aforementioned fourth aspect, a sixth aspect of the present disclosure may be that the support contains metal.

In the respective aforementioned first aspect to the aforementioned fourth aspect, a seventh aspect of the present disclosure may be that the mask body and the support contain metal.

In the respective aforementioned first aspect to the aforementioned seventh aspect, an eighth aspect of the present disclosure may be that:

the support has the first surface located on the side of the mask body, and the second surface located on the opposite side of the side of the mask body; and a distance between the second point and the first surface of the support along the normal direction of the support is smaller than a distance between the second point and the second surface of the support along the normal direction of the support.

In the respective aforementioned first aspect to the aforementioned eighth aspect, a ninth aspect of the present disclosure may be that:

the support has the first surface located on the side of the mask body, and the second surface located on the opposite side of the side of the mask body;

the second through-hole has the second wall nearest to the outermost circumference first through-hole, in the first cross-section;

the second through-hole has a first surface side connection part which connects the second wall and the first surface of the support, and a second surface side connection part which connects the second wall and the second surface of the support; and the second surface side connection part of the second through-hole is located on the second side in the plane direction of the support, with respect to the first surface side connection part of the second through-hole.

In the respective aforementioned first aspect to the aforementioned ninth aspect, a tenth aspect of the present disclosure may be that the support includes two or more layers.

In the aforementioned tenth aspect, an eleventh aspect of the present disclosure may be that the support has a first layer located on the side of the mask body, and a second layer located on the opposite side of the side of the mask body.

In the aforementioned eleventh aspect, a twelfth aspect of the present disclosure may be that a thickness of the first layer is smaller than a thickness of the second layer.

In the aforementioned eleventh aspect, a thirteenth aspect of the present disclosure may be that a thickness of the first layer is larger than a thickness of the second layer.

In the aforementioned eleventh aspect, a fourteenth aspect of the present disclosure may be that a thickness of the first layer is equal to a thickness of the second layer.

The respective aforementioned eleventh aspect to the aforementioned fourteenth aspect, a fifteenth aspect of the present disclosure may have an adhesive layer positioned between the first layer and the second layer.

The respective aforementioned eleventh aspect to the aforementioned fourteenth aspect, a sixteenth aspect of the present disclosure may have a plated layer positioned across a surface of the first layer and a surface of the second layer.

The respective aforementioned eleventh aspect to the aforementioned fourteenth aspect, a seventeenth aspect of the present disclosure may have an adhesive layer positioned between the first layer and the second layer, and a plated layer positioned across a surface of the first layer and a surface of the second layer.

FIGS. 1 to 15C are views for describing a first embodiment of the present disclosure. In the below embodiment, a deposition mask used for patterning an organic material on a substrate in a desired pattern in order to manufacture an organic EL display device is described by way of example. However, the present disclosure is not limited to this application, and can be applied to a deposition mask used for various purposes.

Firstly, a deposition apparatus 90 for performing a deposition process for depositing a deposition material onto an object is explained with reference to FIG. 1. As shown in FIG. 1, the deposition apparatus 90 may comprise therein a deposition source (e.g., a crucible 94), a heater 96, and a deposition mask apparatus 10. In addition, the deposition apparatus 90 may further comprise exhaust means to create a vacuum atmosphere inside of the deposition apparatus 90. The crucible 94 may accommodate a deposition material 98 such as an organic luminescent material. The heater 96 may heat the crucible 94 so as to evaporate the deposition material 98 in the vacuum atmosphere. The deposition mask apparatus 10 may be located on an opposite side of the crucible 94.

As shown in FIG. 1, the deposition mask apparatus 10 may comprise a deposition mask 20 and a frame 15 for supporting the deposition mask 20. In this case, the deposition mask 20 may be supported by the frame 15 in such a manner that the deposition mask 20 is pulled into a taut state in its planar direction lest the deposition mask 20 is warped, or may be supported by the frame 15 in such a manner that the deposition mask 20 is not pulled in its planar direction. As shown in FIG. 1, the deposition mask apparatus 10 may be disposed in the deposition apparatus 90 such that the deposition mask 20 faces a substrate to be deposited (e.g., a substrate for organic EL) 92, which is an object onto which the deposition material 98 is to be deposited.

As shown in FIG. 1, the deposition mask apparatus 10 may include a magnet 93 disposed on a surface of the substrate for organic EL 92, which is opposite to the surface on the deposition mask 20 side. By providing the magnet 93, the deposition mask 20 can be attracted to the magnet 93 by magnetic force, so that the deposition mask 20 can be brought into tight contact with the substrate to be deposited 92.

Next, a deposition mask 20 of the deposition mask apparatus 10 is described. As shown in FIG. 1, the deposition mask 20 may comprise a mask body 30 having two or more through-holes 35, and a support 40 disposed on the mask body 30 and having a second through-hole 45 located at a position overlapped with the through-holes 35 in a plan view.

The deposition mask 20 may have a first surface 20a and a second surface 20b that is located on an opposite side of the first surface 20a. In the illustrated example, the deposition mask 20 may be disposed between the substrate to be deposited 92 and the crucible 94. The deposition mask 20 may be supported in the deposition apparatus 90 such that its second surface 20a is located on the substrate to be deposited 92 side, in other words, such that its second surface 20b is located on the crucible 94 side, and may be used for depositing the deposition material 98 onto the substrate to be deposited 92. In the deposition apparatus 90 shown in FIG. 1, the deposition material 98 evaporated from the crucible 94 to reach the deposition mask 20 from the first surface 20a side may adhere to the substrate to be deposited 95 through the second through-hole 45 of the support 40 and the first through-holes 35 of the mask body 30. Thus, the deposition material 98 can be adhered to the surface of the substrate to be deposited 92 in a desired pattern corresponding to the positions of the first through-holes 35 of the mask body 30.

Figure 2:
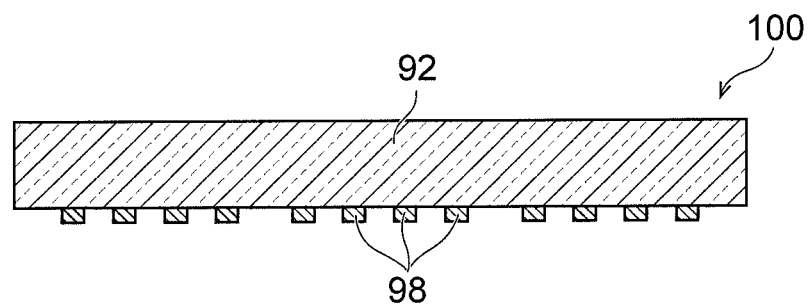
FIG. 2 is a cross-sectional view showing an example of an organic EL display device manufactured by the deposition apparatus shown in FIG. 1.

FIG. 2 is a cross-sectional view showing an organic EL display device 100 manufactured by using the deposition apparatus 90 of FIG. 1. The organic EL display device 100 may comprise the substrate to be deposited (substrate for organic EL) 92 and patterned pixels containing the deposition materials 98. In FIG. 2, illustration of an electrode for applying a voltage to the pixel containing the deposition material 98 of the organic EL display device 100 is omitted. In addition, after a deposition step in which the deposition material 98 is deposited in a pattern onto the substrate for organic EL 92, the organic EL display device 100 of FIG. 2 may be further provided with another constituent element of the organic EL display device. Thus, the organic EL display device 100 of FIG. 2 may be referred to as an intermediate member of an organic EL display device.

When a color display is desired with two or more colors, deposition apparatuses 90 equipped with deposition mask apparatuses 10 corresponding to the respective colors may be prepared, and the substrate to be deposited 92 may be sequentially introduced into the respective deposition apparatuses 90. Accordingly, for example, an organic luminescent material for red color, an organic luminescent material for green color, and an organic luminescent material for blue color can be sequentially deposited on the substrate to be deposited 92.

The deposition process may be performed inside the deposition apparatus 90 in a high-temperature atmosphere. In this case, during the deposition process, the deposition mask apparatus 10 and the substrate to be deposited 92, which are held inside the deposition apparatus 90, may also be heated. At this time, the mask body 30, the support 40 and the frame 15 of the deposition mask apparatus 10 as well as the substrate to be deposited 92 may develop dimensional change behaviors based on their respective thermal expansion coefficients. Thus, when a difference between the thermal expansion coefficients of the mask body 30, the support 40 and the frame 15, and the thermal expansion coefficient of the substrate to be deposited 92 is small, a difference between dimensional change of the deposition mask 20 and dimensional change of the organic dimensional substrate 92 is also small. This is advantageous in that dimensional precision and/or positional precision of the deposition material adhering to the substrate to be deposited 92 can be improved.

In order to achieve this effect, the thermal expansion coefficients of the mask body 30, the support 40 and the frame 15 may be equivalent to the thermal expansion coefficient of the substrate to be deposited 92. For example, when a glass substrate is used as the substrate to be deposited 92, an iron alloy containing nickel may be used as a main material of the mask body 30, the support 40 and the frame 15. For example, as a material for forming the mask body 30, the support 40 and the frame 15, an iron alloy containing not less than 30% by mass and not more than 54% by mass of nickel may be used. Specific examples of an iron alloy containing nickel can be an invar material containing not less than 34% by mass and not more than 38% by mass of nickel, a super invar material containing cobalt in addition to not less than 30% by mass and not more than 34% by mass of nickel, and a low thermal expansion Fe—Ni based plated alloy not less than 38% by mass and not more than 54% by mass of nickel.

When the temperatures of the mask body 30, the support 40 and the frame 15 of the deposition mask apparatus 10 and the temperature of the substrate to be deposited 92 do not reach high temperatures during the deposition process, it is not necessary that the thermal expansion coefficients of the mask body 30, the support 40 and the frame 15 are equivalent to the thermal expansion coefficient of the substrate to be deposited 92. In this case, a material other than the aforementioned iron alloy may be used as the material forming the mask body 30, the support 40 and the frame 15. For example, an alloy other than the aforementioned iron alloy containing nickel, such as an iron alloy containing chromium, may be used. As an iron alloy containing chromium, for example, an iron alloy, which is called so-called stainless steel, may be used. In addition, alloys such as a nickel or nickel-cobalt alloy other than iron alloys may be used.

Figure 3:
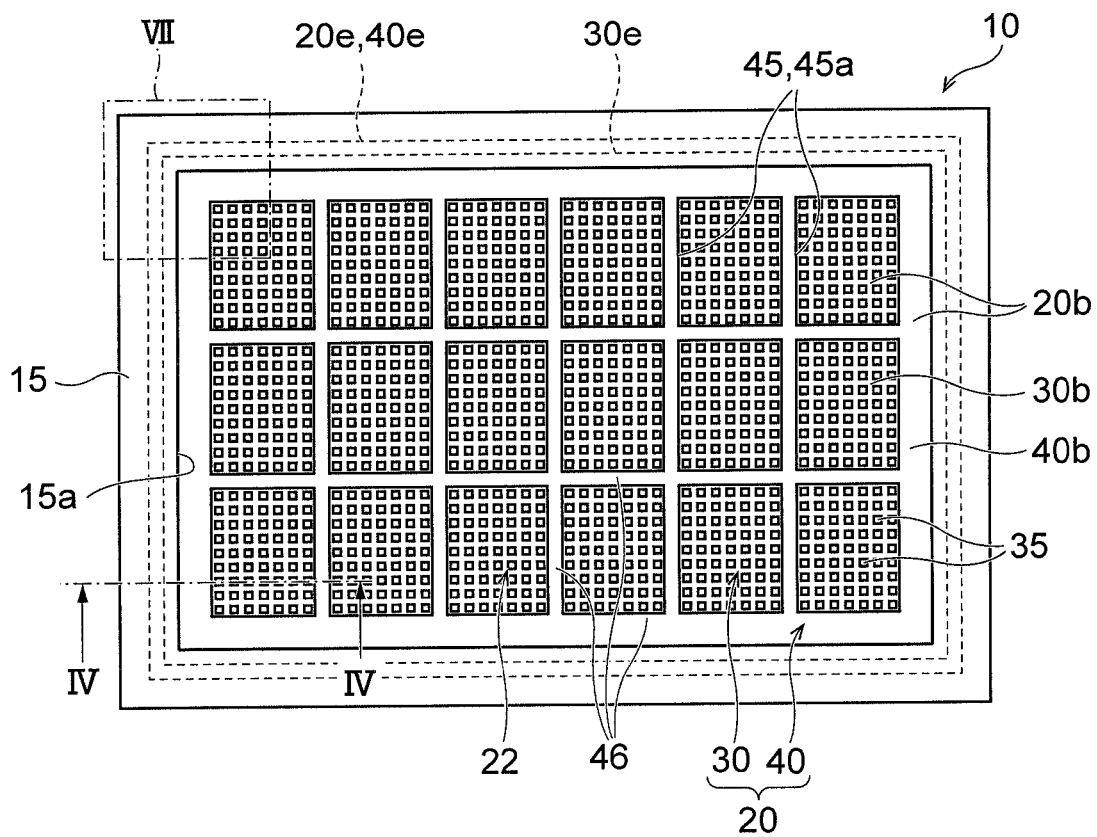
FIG. 3 is a plan view schematically showing an example of a deposition mask apparatus having a deposition mask.
Figure 4:
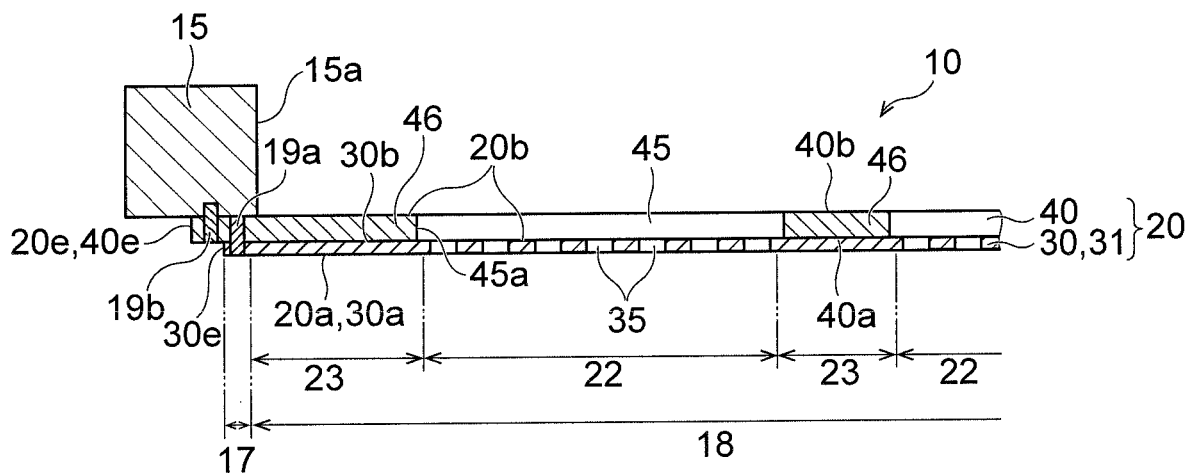
FIG. 4 is a view showing the deposition mask apparatus in a cross-section corresponding to a IV-IV line of FIG. 3.

Next, the deposition mask apparatus 10 and the deposition mask 20 are described with reference to FIGS. 1 and 3 to 7A. FIG. 3 is a plan view schematically showing an example of the deposition mask apparatus 10 having the deposition mask 20, which shows the deposition mask apparatus 10 seen from the second surface 20b side of the deposition mask 20. FIG. 4 is a cross-sectional view of the deposition mask apparatus 10, which shows the deposition mask apparatus 10 in a cross-section corresponding to a IV-IV line of FIG. 3.

In the example shown in FIG. 3, the deposition mask 20 may have an outline of, for example, a quadrangular shape in a plan view, more precisely, a rectangular shape in a plan view. The frame 15 may be formed to have a rectangular frame shape. The deposition mask 20 may be attached to the frame 15 such that each side of the deposition mask 20 corresponds to each side of the frame 15. In this specification, the "quadrangular shape" and the "rectangular shape" include a "quadrangular shape" and a "rectangular shape" each having rounded or cut corners.

The deposition mask 20 may comprise the mask body 30 and the support 40 which are located at positions overlapped with each other. In other words, the deposition mask 20 may comprise the mask body 30, and the support 40 disposed on the mask body 30. A plane of the mask body 30 and a plane of the support 40 may be parallel to each other. Thus, a normal direction of the deposition mask 20, a normal direction of the mask body 30 and a normal direction of the support 40 may correspond to one another. The mask body 30 may have a first surface 30a located on an opposite side of the support 40 side, and a second surface 20b located on the support 40 side. In addition, the support 40 may have a first surface located on the mask body 30 side, and a second surface 40b located on an opposite side of the mask body 30. The mask body 30 may be positioned on the first surface 20a side of the deposition mask 20 with respect to the support 40. Thus, the first surface 20a of the deposition mask 20 may be formed by the first surface 30a of the mask body 30. The second surface 20b of the deposition mask 20 may be formed by the second surface 40b of the support 40 and a part of the second surface 30b of the mask body 30, which is located at a position overlapped with the second through-hole 45 of the support 40. The support 40 and the mask body 30 may respectively have a rectangular outline in a plan view. Particularly, the outline defining the support 40 in a plan view may surround the outline defining the mask body 30.

Figure 7A:
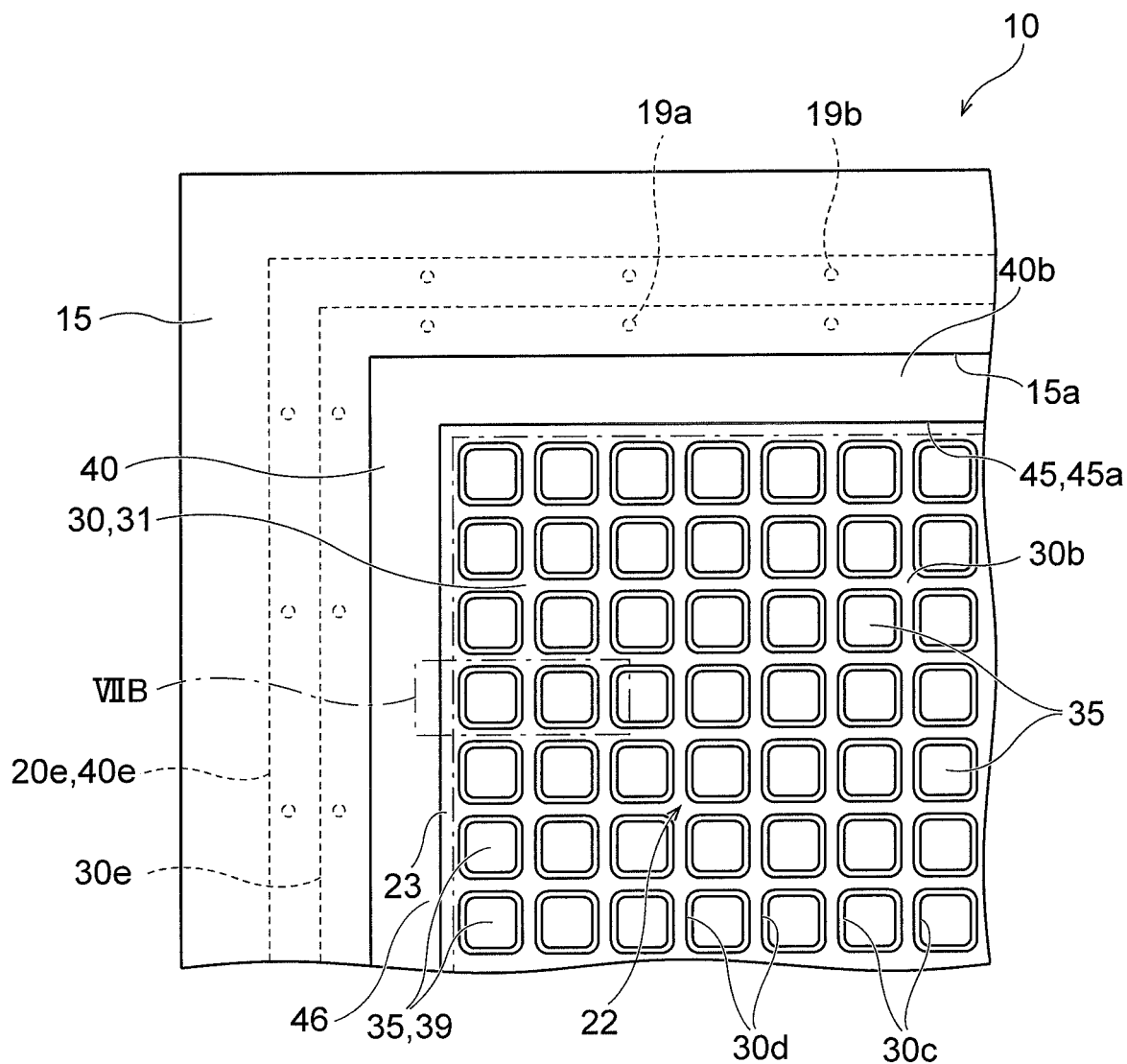
FIG. 7A is a partial plan view of the deposition mask apparatus, showing a part indicated by VIIA of FIG. 3, which is seen from a first surface side of the deposition mask.

The support 40 and the mask body 30 of the deposition mask 20 may be fixed to each other. To this end, the deposition mask 20 may have two or more first joints 19a that join the support 40 and the mask body 30 to each other. In addition, the support 40 and the frame 15 may be fixed to each other. To this end, the deposition mask apparatus 10 may have two or more second joints 19b that join the support 40 and the frame to each other. The first joints 19a may be arranged along an outer periphery 30e of the mask body 30, and the second joints 19b may be arranged along an outer periphery 40e of the support 40. The mask body 30 and the support 40 may have a rectangular outline in a plan view. Namely, the joints 19a, 19b may also be arranged in a rectangular pattern along the outer peripheries 30e, 40e. In this embodiment, as shown in FIG. 7A, the joints 19a, 19b may be respectively arranged on one straight line with a certain distance from the outer peripheries 30e, 40e. Namely, the joints 19a, 19b may respectively be arranged along a direction in which the outer peripheries 30e, 40e extend.

In the example shown in FIG. 7A, the joints 19a, 19b may be respectively arranged equidistantly along the direction in which the outer peripheries 30e, 40e extend. In this embodiment, the mask body 30 and the support 40, and the support 40 and the frame 15 may be joined to each other by spot welding. However, not limited thereto, the mask body 30 and the support 40, and the support 40 and the frame 15 may be joined to each other by another fixing means such as an adhesive.

Figure 5:
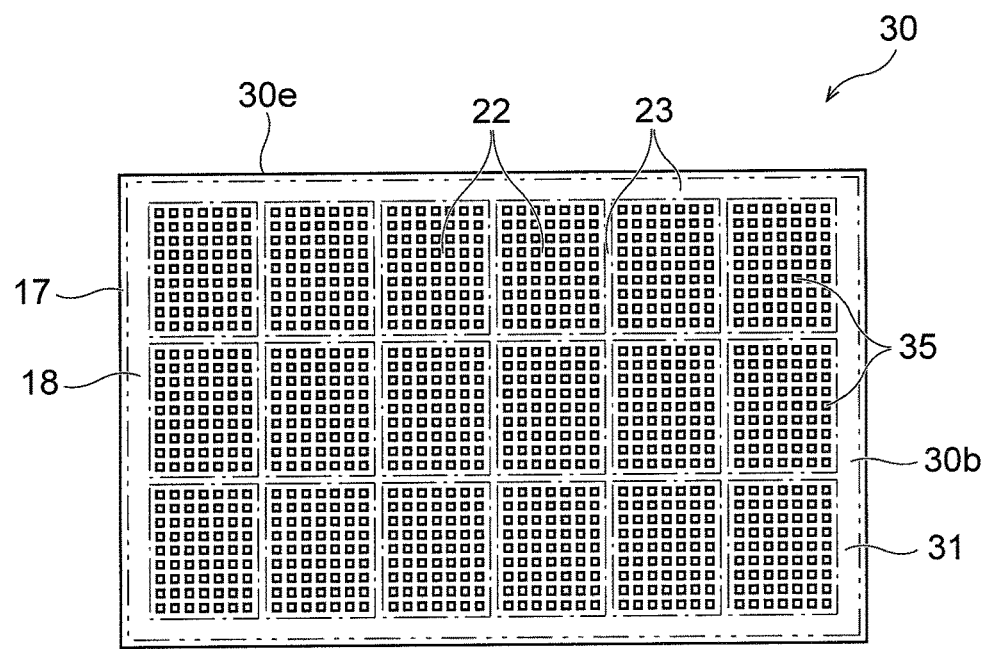
FIG. 5 is a plan view showing an example of a mask body of the deposition mask.
Figure 6:
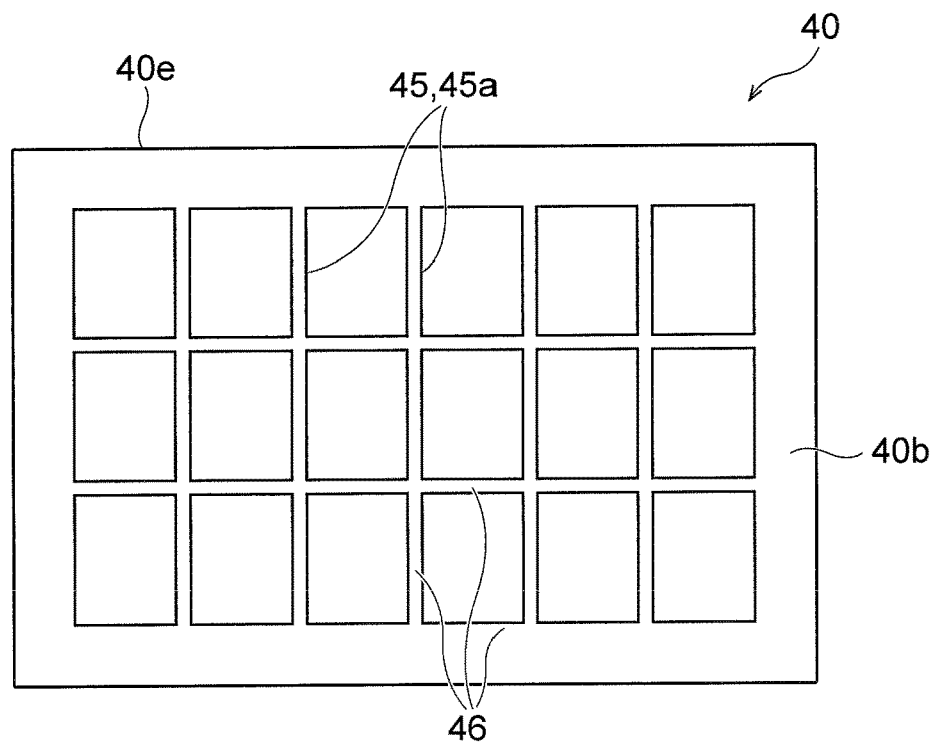
FIG. 6 is a plan view showing an example of a support of the deposition mask.
Figure 7B:
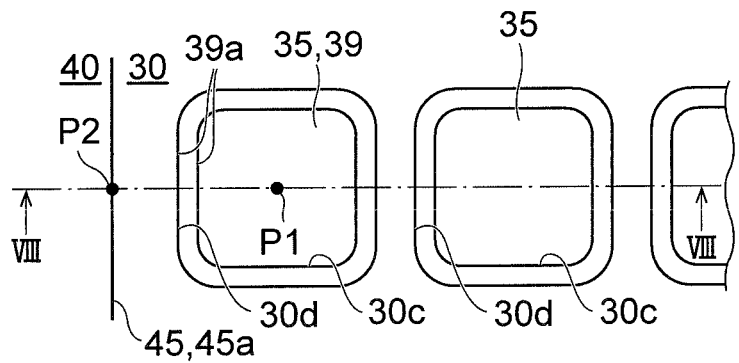
FIG. 7B is an enlarged view of a part indicated by VIIB of FIG. 7A.

Next, the mask body 30 and the support 40 of the deposition mask 20, and the frame 15 are described in more detail with reference to FIGS. 1 and 3 to 7B. FIG. 5 is a plan view showing an example of the mask body 30. FIG. 6 is a plan view showing an example of the support 40. FIG. 7A is a partial plan view of the deposition mask apparatus, which shows a part indicated by VIIA of FIG. 3, which is seen from the second surface 20b side of the deposition mask 20. FIG. 7B is an enlarged view of a part indicated by VIIB of FIG. 7A.

As shown in FIG. 5, the mask body 30 may have a rectangular shape in a plan view. The mask body 30 may have a frame-like ear part 17 forming the outer periphery 30e of the mask body 30, and an intermediate part 18 surrounded by the ear part 17. The ear part 17 may be a portion of the mask body 30, which is to be attached to the support 40. The ear part 17 is not an area through which the deposition material 98 intended to be deposited onto the substrate for organic EL 92 passes.

In addition, as shown in FIG. 5, the intermediate part 18 may include an effective area 22 in which first through-holes 35 are regularly formed, and a peripheral area 23 surrounding the effective area 22. The peripheral area 22 may be an area for supporting the effective area 22, and may not be an area through which the deposition material 98 intended to be deposited onto the substrate for organic EL 92 passes. On the other hand, the effective area 22 may be an area in the mask body 30 which is used for depositing an organic luminescent material, the area overlapping with a region that will serve as a display area of the substrate for organic EL 92 onto which an organic luminescent material is deposited to form pixels. However, for various reasons, through-holes or recesses may be formed in the peripheral area 23. Each effective area 22 may have an outline of, for example, a quadrangular shape in a plan view, more precisely, a rectangular shape in a plan view. Although not shown, each effective area 22 may have an outline having a variable shape depending on a shape of the display area of the substrate for organic EL 92. Namely, each effective area 22 may have an outline corresponding to a shape of the display area of each application displayed by the organic EL display device 100. For example, when the organic EL display device 100 is used in a wristwatch, each effective area 22 may have a circle outline.

As shown in FIGS. 3 and 5, the two or more effective areas 22 of the mask body 30 may be arranged with predetermined spacings therebetween along two directions orthogonal to each other. In the illustrated example, one effective area 22 may correspond to one organic EL display device 100. Namely, the deposition mask apparatus 10 (mask body 30) shown in FIGS. 3 and 4 enables a multifaceted deposition. As shown in FIGS. 3, 5 and 7A, the two or more first through-holes 35 formed in each effective area 22 may be arranged in the effective area 22 at predetermined pitches along two directions orthogonal to each other.

Next, the support 40 is described in detail. As shown in FIGS. 3 and 6, the support 40 may have a rectangular shape in a plan view. The support 40 may have a dimension larger than that of the mask body 30 in a planar direction. In a plan view, the outline delimiting the support 40 may surround the outline delimiting the mask body 30. The support 40 may be attached to the mask body 30 such that the respective sides of the support 40 correspond to the respective sides of the mask body 30.

In addition, as described above, the two or more second through-holes 45 may be formed in the support 40. The through-hole 45 may be larger than the effective area 22 of the mask body 30 in a plan view. In addition, the through-hole 45 of the support 40 may correspond to one effective area 22 of the mask body 30.

As shown in FIGS. 3 and 6, the second through-hole 45 may have an outline 45a of, for example, a quadrangular shape in a plan view, more precisely, a rectangular shape in a plan view. Although not shown, each second through-hole 45 may have an outline having a variable shape depending on a shape of the display area of the substrate to be deposited (substrate for organic EL) 92. Namely, each second through-hole 45 may have a shape corresponding to a shape of the display area of each application displayed by the organic EL display device 100. For example, when the organic EL display device 100 is used in a wristwatch, each second through-hole 45 may have a circle outline. FIG. 3 shows that the respective second through-holes 45 may have the same shape in a plan view. However, not limited thereto, the respective second through-holes 45 may have shapes different from each other. In other words, the support 40 may have the two or more second through-holes 45 having shapes different from each other in a plan view.

A support area 46 may be provided around the second through-hole 45. The support area 46 may be configured to support the peripheral area 23 of the mask body 30. Thus, since the support 40 can support the mask body 30 so as to surround the effective areas 22 of the mask body 30, the mask body 30 can be prevented from being wrinkled or deformed. The support area 46 may not be an area through which the deposition material 98 intended to be deposited onto the substrate for organic EL 92 passes.

For example, a thickness T1 of the support 40 may be not less than 0.05 mm, not less than 0.1 mm, not less than 0.5 mm, or not less than 1.0 mm. In addition, for example, the thickness T1 of the support 40 may be not more than 1.5 mm, not or than 2.0 mm, not more than 2.5 mm, or not more than 3 mm. A range of the thickness T1 of the support 40 may be determined from a first group consisting of 0.05 mm, 0.1 mm, 0.5 mm, and 1.0 mm, and/or a second group consisting of 1.5 mm, 2.0 mm, 2.5 mm, and 3 mm. The range of the thickness T1 of the support 40 may be determined by combining a given value of the values included in the aforementioned first group, and a given value of the values included in the aforementioned second group. The range of the thickness T1 of the support 40 may be determined by combining given two values of the values included in the aforementioned first group. The range of the thickness T2 of the support 40 may be determined by combining given two values of the values included in the aforementioned second group. For example, the range of the thickness T1 may be not less than 0.05 mm and not more than 3 mm, not less than 0.05 mm and not more than 2.5 mm, not less than 0.05 mm and not more than 2.0 mm, not less than 0.05 mm and not more than 1.5 mm, not less than 0.05 mm and not more than 1.0 mm, not less than 0.05 mm and not more than 0.5 mm, not less than 0.05 mm and not more than 0.1 mm, not less than 0.1 mm and not more than 3 mm, not less than 0.1 mm and not more than 2.5 mm, not less than 0.1 mm and not more than 2.0 mm, not less than 0.1 mm and not more than 1.5 mm, not less than 0.1 mm and not more than 1.0 mm, not less than 0.1 mm and not more than 0.5 mm, not less than 0.5 mm and not more than 3 mm, not less than 0.5 mm and not more than 2.5 mm, not less than 0.5 mm and not more than 2.0 mm, not less than 0.5 mm and not more than 1.5 mm, not less than 0.5 mm and not more than 1.0 mm, not less than 1.0 mm and not more than 3 mm, not less than 1.0 mm and not more than 2.5 mm, not less than 1.0 mm and not more than 2.0 mm, not less than 1.0 mm and not more than 1.5 mm, not less than 1.5 mm and not more than 3 mm, not less than 1.5 mm and not more than 2.5 mm, not less than 1.5 mm and not more than 2.0 mm, not less than 2.0 mm and not more than 3 mm, not less than 2.0 mm and not more than 2.5 mm, or not less than 2.5 mm and not more than 3 mm.

When the thickness T1 of the support 40 is not less than 0.05 mm, the rigidity of the deposition mask 20 can be improved. Thus, the mask body 30 can be prevented from being wrinkled and/or deformed. On the other hand, when the thickness T1 of the support 40 is not more than 3 mm, in a step of peeling a base member 51 from the mask body 30 joined to the support 40 as described below, it can be prevented that the base member 51 cannot be peeled therefrom.

For example, a modulus of rigidity G of the support 40 may be not less than 50 GPa, not less than 52 GPa, not less than 54 GPa, or not less than 56 GPa. In addition, for example, the modulus of rigidity G of the support may be not more than 58 GPa, not more than 60 GPa, not more than 62 GPa, or not more than 65 GPa. A range of the modulus of rigidity G of the support 40 may be determined from a first group consisting of 50 GPa, 52 GPa, 54 GPa, and 56 GPa, and/or a second group consisting of 58 GPa, 60 GPa, 62 GPa, and 65 GPa. The range of the modulus of rigidity G of the support 40 may be determined by combining a given value of the values included in the aforementioned first group, and a given value of the values included in the aforementioned second group. The range of the modulus of rigidity G of the support 40 may be determined by combining given two values of the values included in the aforementioned first group. The range of the modulus of rigidity G of the support 40 may be determined by combining given two values of the values included in the aforementioned second group. For example, the range of the modulus of rigidity G may be not less than 50 GPa and not more than 65 GPa, not less than 50 GPa and not more than 62 GPa, not less than 50 GPa and not more than 60 GPa, not less than 50 GPa and not more than 58 GPa, not less than 50 GPa and not more than 56 GPa, not less than 50 GPa and not more than 54 GPa, not less than 50 GPa and not more than 52 GPa, not less than 52 GPa and not more than 65 GPa, not less than 52 GPa and not more than 62 GPa, not less than 52 GPa and not more than 60 GPa, not less than 52 GPa and not more than 58 GPa, not less than 52 GPa and not more than 56 GPa, not less than 52 GPa and not more than 54 GPa, not less than 54 GPa and not more than 65 GPa, not less than 54 GPa and not more than 62 GPa, not less than 54 GPa and not more than 60 GPa, not less than 54 GPa and not more than 58 GPa, not less than 54 GPa and not more than 56 GPa, not less than 56 GPa and not more than 65 GPa, not less than 56 GPa and not more than 62 GPa, not less than 56 GPa and not more than 60 GPa, not less than 56 GPa and not more than 58 GPa, not less than 58 GPa and not more than 65 GPa, not less than 58 GPa and not more than 62 GPa, not less than 58 GPa and not more than 60 GPa, not less than 60 GPa and not more than 65 GPa, not less than 60 GPa and not more than 62 GPa, or not less than 62 GPa and not more than 65 GPa.

When the modulus of rigidity of the support 40 is not less than 50 GPa, the mask body 30 can be prevented from being wrinkled or deformed. On the other hand, when the modulus of rigidity of the support 40 is not more than 65 GPa, in a step of peeling a base member 51 from the mask body 30 joined to the support 40 as described below, it can be prevented that the base member 51 cannot be peeled therefrom.

As a main material forming the support 40, an iron alloy containing nickel may be used. For example, an iron alloy that is an invar material containing not less than 34% by mass and not more than 38% by mass of nickel, or a super invar material containing cobalt in addition to nickel may be used. Not limited thereto, as a main material forming the support 40, an iron alloy other than the aforementioned iron alloy containing nickel, such as an iron alloy containing chromium, may be used. As an iron alloy containing chromium, for example, an iron alloy, which is called so-called stainless steel, can be used. In addition, alloys such as a nickel or nickel-cobalt alloy other than iron alloys may be used.

As shown in FIG. 7A, the two or more first through-holes 35 exposed into one second through-hole 45 of the support 40 may include outermost circumference first through-holes 39 positioned on an outermost circumference in a plan view. In a plan view, the outermost circumference first through-hole 39 is the first through-holes 35 nearest to the outline 45a of the second through-hole 45. In other words, the two or more first through-holes 35 located at a position overlapped with one second through-hole 45 do not include any first through-holes positioned nearer to the outline 45a of the second through-hole 45 than the outermost circumference first through-holes 39 in a plan view.

FIG. 7B is an enlarged view of a part indicated by VIIB of FIG. 7A. The outermost circumference first through-hole 39 may have a first point P1 that is a center of the outermost circumference first through-hole 39 in a plan view. The first point P1 of the outermost circumference first through-hole 39 may be defined as a first point P1f gravity of the outermost circumference first through-hole 39 in a plan view. The outline 45a of the second through-hole 45 may include a second point P2 nearest to the first point P1 of the outermost circumference first through-hole 39. The second point P2 may be a point on the outline 45a, which has a shortest distance from the first point P1. In other words, in a plan view, the second point P2 may be a point on the outline 45a of a line segment having a shortest length of line segments connecting the first point P1 and a given point on the outline 45a. For example, when the outline 45a near a certain outermost circumference first through-hole 39 extends to have a linear shape, the second point P2 may be an intersection point at which a perpendicular line extending from the first point P1 of the outermost circumference first through-hole 39 to the outline 45a and the outline 45a intersect.

Figure 8:
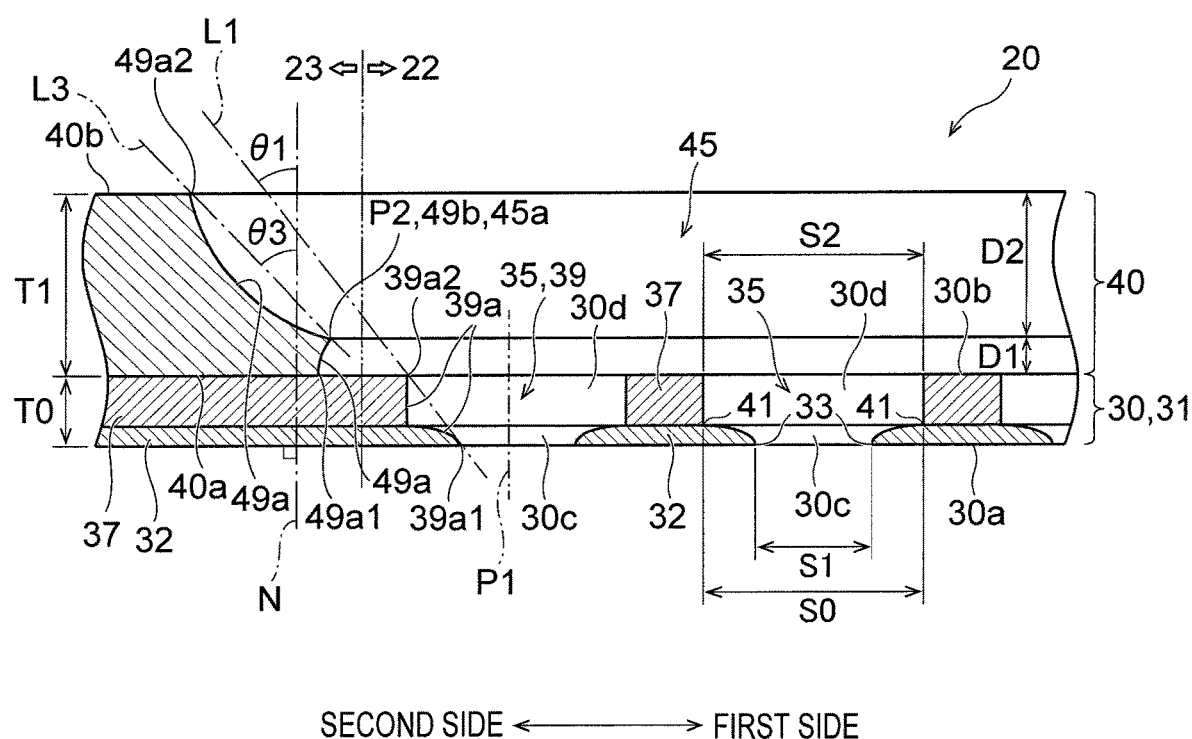
FIG. 8 is a view showing the deposition mask in a cross-section corresponding to a VIII-VIII line of FIG. 7B.

Next, cross-sectional shapes of the mask body 30 and the support 40 of the deposition mask 20 are described in detail with reference to FIG. 8. FIG. 8 is a view showing the deposition mask 20 in a cross-section corresponding to a VIII-VIII line of FIG. 7B. In particular, FIG. 8 shows the deposition mask 20 in a first cross-section that is a plane which includes the first point P1 of the outermost circumference first through-hole 39 and the second point P2 of the outline 45a of the second through-hole 45 and is parallel to a normal direction N of the mask body 30.

The mask body 30 in this embodiment may have a metal layer 31. As shown in FIG. 8, the metal layer 31 may include a first metal layer 32 in which first openings 30c are provided in a predetermined pattern, and a second metal layer 37 in which second openings 30d in communication with the first openings 30c are provided. In the illustrated example, the first metal layer 32 may be located on the first surface 30a side of the mask body 30, and the second metal layer 37 may be located on the second surface 30b side of the mask body 30. Namely, in the deposition step, the first metal layer 32 of the mask body 30 may be positioned on the substrate to be deposited 92 side.

In this embodiment, the first opening 30c and the second opening 30d are in communication with each other, so that the first through-hole 35 passing through the mask body 30 may be formed. In this case, a dimension and a shape of the first through-hole 35 on the first surface 30a side of the mask body 30 may be defined by a shape the first opening 30c of the first metal layer 32. On the other hand, a dimension and a shape of the first through-hole 35 on the second surface 30b side of the mask body 30 may be defined by a shape of the second opening 30d of the second metal layer 37. In other words, both the shape delimited by the shape of the first opening 30c of the first metal layer 32, and the shape delimited by the shape of the second opening 30d of the second metal layer 37 may be given to the first through-hole 35.

As shown in FIG. 5, the shapes of the first opening 30c and the second opening 30d that form the first through-hole 35 may be a polygonal shape in a plan view. Herein, an example in which the first opening 30c and the second opening 30d have a substantially quadrangular shape, more specifically, a substantially square shape, is shown. Although not shown, the shapes of the first opening 30c and the second opening 30d may be another substantially polygonal shape such as a hexagonal shape or an octagonal shape. The "polygonal shape", the "quadrangular shape", the "square shape", the "hexagonal shape" and the "octagonal shape" are a concept including a "polygonal shape", a "quadrangular shape", a "square shape", a "hexagonal shape" and an "octagonal shape" each having rounded corners. In addition, although not shown, the shapes of the first opening 30c and the second opening 30d may be circles. It is not necessary that the shape of the first opening 30c and the shape of the second opening 30 are analogue, as long as the second opening 30d has an outline that surrounds the first opening 30c in a plan view.

In FIG. 8, the reference number 41 depicts a connection part at which the first metal layer 32 and the second metal layer 37 are connected. In addition, the reference number S0 depicts a dimension of the first through-hole 35 at the connection part 41 between the first metal layer 32 and the second metal layer 37. FIG. 8 shows an example in which the first metal layer 32 and the second metal layer 37 are in contact with each other. However, not limited thereto, another layer may be interposed between the first metal layer 32 and the second metal layer 37. For example, a catalyst layer, which promotes precipitation of the second metal layer 37 on the first metal layer 32, may be provided between the first metal layer 32 and the second metal layer 37.

As shown in FIG. 8, an opening dimension S2 of the first through-hole 35 (second opening 30d) at the second surface 30b may be larger than an opening dimension S1 of the first through-hole 35 (first opening 30c) at the first surface 30a. Herebelow, an advantage obtained by the thus formed first metal layer 32 and the second metal layer 37 is described.

The deposition material 98 flying from the second surface 30b side of the mask body 30 toward the mask body 30 may pass through the second opening 30d of the first through-hole 35 and the first opening 30c thereof in this order so as to adhere to the substrate for organic EL 90. An area of the substrate for organic EL 92, to which the deposition material 98 adheres, may be mainly determined by the opening dimension S1 and the opening shape of the first through-hole 35 at the first surface 30a. The deposition material 98, which moves from the crucible 94 toward the substrate for organic EL 92, not only moves along the normal direction N of the mask body 30, but also may move in a direction that is largely inclined with respect to the normal direction N of the mask body 30. If the opening dimension S2 of the first through-hole 35 at the second surface 30b is equal to the opening dimension S1 of the first through-hole 35 at the first surface 30a, most of the deposition material 98 that moves in a direction largely inclined to the normal direction N of the mask body 30 reaches a wall surface 36 of the second opening 30d of the first through-hole 35 to adhere thereto, before it reaches the substrate for organic EL 92 through the first through-hole 35. Thus, in order to improve use efficiency of the deposition material 98, it can be said that the enlarged opening dimension S2 of the second opening 30d is preferable.

The aforementioned opening dimensions S0, S1 and S2 are suitably set in consideration of a pixel density of the organic EL display device and a predetermined value of the aforementioned angle θ1. For example, the dimension S0 of the opening of the first through-hole 35 at the connection part 41 may be not less than 20 μm, not less than 25 μm, not less than 30 μm, or not less than 35 μm. In addition, for example, the dimension S0 may be not or than 45 μm, not more than 50 μm, not more than 55 or not more than 60 μm. A range of the dimension S0 may be determined from a first group consisting of 20 μm, 25 μm, 30 μm, and 35 μM, and/or a second group consisting of 45 μm, 50 μm, 55 μm, and 60 μm. The range of the dimension S0 may be determined by combining a given value of the values included in the aforementioned first group, and a given value of the values included in the aforementioned second group. The range of the dimension S0 may be determined by combining two given values of the values included in the aforementioned first group. The range of the dimension may be determined by combining two given values of the values included in the aforementioned second group. For example, the range of the dimension S0 may be not less than 20 μm and not more than 60 μm, not less than 20 μm and not more than 55 μm, not less than 20 μm and not more than 50 μm, not less than 20 μm and not more than 45 μM, not less than 20 μm and not more than 35 μm, not less than 20 μm and not more than 30 μm, not less than 20 μm and not more than 25 μm, not less than 25 μm and not more than 60 μm, not less than 25 μm and not more than 55 μm, not less than 25 μm and not more than 50 μm, not less than 25 μm and not more than 45 not less than 25 μm and not more than 35 μm, not less than 25 μm and not more than 30 μm, not less than 30 μm and not more than 60 μm, not less than 30 μm and not more than 55 μm, not less than 30 μm and not more than 50 μm, not less than 30 μm and not more than 45 μM, not less than 30 μm and not more than 35 μm, not less than 35 μm and not more than 60 μm, not less than 35 μm and not more than 55 μm, not less than 35 μm and not more than 50 μm, not less than 35 μm and not more than 45 μm, not less than 45 μm and not more than 60 μm, not less than 45 μm and not more than 55 μm, not less than 45 μm and not more than 50 μm, not less than 50 μm and not more than 60 μm, not less than 50 μm and not more than 55 μm, or not less than 55 μm and not more than 60 μm.

For example, the dimension S1 of the first opening 30c at the first surface 30a may be not less than 10 μm, not less than 15 μm, not less than 20 μm, or not less than 25 μm. In addition, for example, the dimension S1 may be not more than 35 μm, not more than 40 μm, not more than 45 μm, or not more than 50 μm. A range of the dimension S1 may be determined by a first group consisting of 10 μm, 15 μm, 20 μm, and 25 μm, and/or a second group consisting of 35 μm, 40 μm, 45 μm, and 50 μm. The range of the dimension S1 may be determined by a given value of the values included in the aforementioned first group, and a given value of the values included in the aforementioned second group. The range of the dimension S1 may be determined by two values of the values included in the aforementioned first group. The range of the dimension S1 may be determined by two values of the values included in the aforementioned second group. For example, the range of the dimension S1 may be not less than 10 μm and not more than 50 μm, not less than 10 μm and not more than 45 μm, not less than 10 μm and not more than 40 μm, not less than 10 μm and not more than 35 μm, not less than 10 μm and not more than not less than 10 μm and not more than 20 μm, not less than 10 μm and not more than 15 μm, not less than 15 μm and not more than 50 μm, not less than 15 μm and not more than 45 μm, not less than 15 μm and not more than 40 μm, not less than 15 μm and not more than 35 μm, not less than 15 μm and not more than 25 μm, not less than 15 μm and not more than 20 not less than 20 μm and not more than 50 μm, not less than 20 μm and not more than 45 μm, not less than 20 μm and not more than 40 μm, not less than 20 μm and not more than 35 μm, not less than 20 μm and not more than 25 μm, not less than 25 μm and not more than 50 μm, not less than 25 μm and not more than 45 μm, not less than 25 μm and not more than 40 μm, not less than 25 μm and not more than 35 μm, not less than 35 μm and not more than 50 μm, not less than 35 μm and not more than 45 μm, not less than 35 μm and not more than 40 μm, not less than 40 μm and not more than 50 μm, not less than 40 μm and not more than 45 μm, or not less than 45 vim and not more than 50 vim.

For example, the dimension S2 of the opening of the second opening 30d at the second surface 30b may be not less than 15 μm, not less than 20 μm, not less than 30 μm, or not less than 40 μm. In addition, for example, the dimension S2 may be not more than 50 μm, not more than 60 μm, not more than 70, or not more than 80 μm. A range of the dimension S2 may be determined from a first group consisting of 15 μm, 20 μm, 30 μm, and 40, and/or a second group consisting of 50 µm, 60 µm, 70 µm, and 80 µm. The range of the dimension S2 may be determined by combining a given value of the values included in the aforementioned first group, and a given values of the values included in the aforementioned second group. The range of the dimension S2 may be determined by combining given two values of the values included in the aforementioned first group. The range of the dimension S2 may be determined by combining given two values of the values included in the aforementioned second group. For example, the range of the dimension S2 may be not less than 15 µm and not more than 80 µm, not less than 15 µm and not more than 70 µm, not less than 15 µm and not more than 60 µm, not less than 15 µm and not more than 50 µm, not less than 15 µm and not more than 40 µm, not less than 15 µm and not more than 30 µm, not less than 15 µm and not more than 20 µm, not less than 20 µm and not more than 80 µm, not less than 20 µm and not more than 70 µm, not less than 20 µm and not more than 60 µm, not less than 20 µm and not more than 50 µm, not less than 20 µm and not more than 40 µm, not less than 20 µm and not more than 30 µm, not less than 30 µm and not more than 80 µm, not less than 30 µm and not more than 70 µm, not less than 30 µm and not more than 60 µm, not less than 30 µm and not more than 50 µm, not less than 30 µm and not more than 40 µm, not less than 40 µm and not more than 80 µm, not less than 40 µm and not more than 70 µm, not less than 40 µm and not more than 60 µm, not less than 40 µm and not more than 50 µm, not less than 50 µm and not more than 80 µm, not less than 50 µm and not more than 70 µm, not less than 50 µm and not more than 60 µm, not less than 60 µm and not more than 80 µm, not less than 60 µm and not more than 70 µm, or not less than 70 µm and not more than 80 vim.

For example, the thickness T0 of the aforementioned mask body 30 may not less than 2 µm, not less than 5 µm, not less than 10 µm, or not less than 15 vim. In addition, for example, the thickness T0 may be not more than 20 µm, not more than 30 µm, not more than 40, or not more than 50 µm. A range of the thickness T0 may be determined from a first group consisting of 2 µm, 5 µm, 10 µm, and 15 µm, and/or a second group consisting of 20 µm, 30 µm, 40 µm, and 50 µm. The range of the thickness T0 may be determined by combining a given value of the values included in the aforementioned first group, and a given value of the values included in the aforementioned second group. The range of the thickness T0 may be determined by combining two given values of the values included in the aforementioned first group. The range of the thickness T0 may be determined by combining two given values of the values included in the aforementioned second group. For example, the range of the thickness T0 may be not less than 2 vim and not more than 50 µm, not less than 2 µm and not more than 40 µm, not less than 2 µm and not more than 30 µm, not less than 2 µm and not more than 20 µm, not less than 2 µm and not more than 15 µm, not less than 2 µm and not more than 10 µm, not less than 2 µm and not more than 5 µm, not less than 5 µm and not more than 50 µm, not less than 5 µm and not more than 40 µm, not less than 5 µm and not more than 30 µm, not less than 5 µm and not more than 20 µm, not less than 5 µm and not more than 15 µm, not less than 5 µm and not more than 10 µm, not less than 10 µm and not more than 50 µm, not less than 10 µm and not more than 40 µm, not less than 10 µm and not more than 30 µm, not less than 10 µm and not more than 20 µm, not less than 10 µm and not more than 15 µm, not less than 15 µm and not more than 50 µm, not less than 15 µm and not more than 40 µm, not less than 15 µm and not more than 30 µm, not less than 15 µm and not more than 20 µm, not less than 20 µm and not more than 50 µm, not less than 20 µm and not more than 40 µm, not less than 20 µm and not more than 30 µm, not less than 30 µm and not more than 50 µm, not less than 30 µm and not more than 40 µm, or not less than 40 µm and not more than 50 µm.

In the first cross-section shown in FIG. 8, the outermost circumference first through-hole 39 may have a first wall 39a nearest to the second point P2. In the illustrated example, the first wall 39a may include a wall on the side near to the second point P2 of a wall forming the outermost circumference first through-hole 39 in the first metal layer 32, and a wall on the side near to the second point P2 of a wall forming the outermost circumference first through-hole 39 in the second metal layer 37.

In the first cross-section shown in FIG. 8, the outermost circumference first through-hole 39 may have a first surface side connection part 39a1 that connects the first wall 39a and the first surface 30a of the mask body 30. When a clear apex is found at a part where the first wall 39a and the first surface 30a are connected, the apex may be regarded as the first surface side connection part 39a1. On the other hand, when no clear apex is found at a part where the first wall 39a and the first surface 30a are connected, a part of the first wall 39a, which is distant from the first surface 30a along the thickness direction (normal direction) of the mask body 30 by 5% of the dimension of the thickness of the mask body 30, may be regarded as the first surface side connection part 39a1.

In the first cross-section shown in FIG. 8, the outermost circumference first through-hole 39 may have a second surface side connection part 39a2 that connects the first wall 39a and the second surface 30b of the mask body 30. When a clear apex is found at a part where the first wall 39a and the second surface 30b are connected, the apex may be regarded as the second surface side connection part 39a2. On the other hand, when no clear apex is found at a part where the first wall 39a and the second surface 30b are connected, a part of the first wall 39a, which is distant from the second surface 30b along the thickness direction (normal direction) of the mask body 30 by 5% of the dimension of the thickness of the mask body 30, may be regarded as the second surface side connection part 39a2.

In the first cross-section shown in FIG. 8, a straight line L1 of straight lines passing the second surface side connection part 39a2 and a given point on the first wall 39a, the straight line L1 having a largest angle with respect to the normal direction N of the mask body 30, is considered. An angle defined between the straight line L1 and the normal direction N is θ1.

The deposition material 98, which moves from the second surface 30b side of the mask body 30 toward the outermost circumference first through-hole 39 at an angle not more than the angle θ1 with respect to the normal direction N, can adhere to the substrate to be deposited 92 exposed into the outermost circumference first through-hole 39, without its course being interfered with by the mask body 30. On the other hand, there is a possibility that the deposition material 98, which moves from the second surface 30b side of the mask body 30 toward the outermost circumference first through-hole 39 at an angle larger than the angle θ1 with respect to the normal direction N, does not appropriately adhere to the substrate to be deposited 92 exposed into the outermost circumference first through-hole 39, because its course is interfered with by the deposition mask 30. In particular it is highly probable that the deposition material 98, which moves from the second surface 30b side of the mask body 30 toward the outermost circumference first through-hole 39 at an angle not more than the angle θ1 with respect to the normal direction N, the deposition material 98 moving toward a part near the first wall 39*a* of the substrate to be deposited 92 exposed into the outermost circumference first through-hole 39, is not appropriately adhere to the substrate to be deposited 92, because its course is interfered with by a part near the second surface side connection part 39*a*2 of the mask body 30.

Thus, the straight line L1 corresponds to a traveling direction of the deposition material 98 that can appropriately adhere to the substrate to be deposited 92 exposed into the outermost circumference first through-hole 39 at the largest angle with respect to the normal direction N. In order to allow the deposition material 98 moving in a direction inclined to the normal direction N to appropriately reach the substrate to be deposited 92 as much as possible without its course being interfered with by the mask body 30, a larger angle θ1 is advantageous. For example, the angle θ1 is preferably not less than 45°.

The support 40 may be positioned, in the plane direction of the support 40, on a second side which is an opposite side to a first side which is a center side of the second through-hole 45 in the first cross-section, with respect to the straight line L1. Preferably, the support 40 may be located only on the second side as compared with the straight line L1. In this case, it can be effectively prevented that the course of the deposition material 98, which moves, at the largest angle θ1 with respect to the normal direction N, toward the substrate to be deposited 92 exposed into the outermost circumference first through-hole 39, is interfered with by the support 40 so that the deposition material 98 cannot appropriately adhere to the substrate to be deposited 92. Namely, generation of shadow can be effectively prevented.

In the deposition mask 20 in this embodiment, the support 40 may not be positioned beyond the straight line L1. In other words, the support 40 may not have a part beyond the straight line L1. In yet other words, the support 40 may not have a part that is in contact with the straight line L1. In this case, it can be effectively prevented that the course of the deposition material 98, which moves, at the largest angle θ1 with respect to the normal direction N, toward the substrate to be deposited 92 exposed into the outermost circumference first through-hole 39, is interfered with by the support 40 so that the deposition material 98 cannot appropriately adhere to the substrate to be deposited 92. Namely, generation of shadow can be effectively prevented.

As described above, in the deposition step, the deposition material 98, which moves toward the substrate to be deposited 92, not only moves along the normal direction N of the deposition mask 20, but also may move in a direction that is largely inclined with respect to the normal direction N of the deposition mask 20. In the deposition apparatus 90, when an angle defined between the traveling direction of the deposition material 98 and the normal direction N of the deposition mask 20 is controlled within a predetermined range, the angle θ1 is preferably set as an angle that is equal to a largest angle defined between the traveling direction of the deposition material 98 and the normal direction N of the deposition mask 20, or an angle that is larger than the largest angle.

In the first cross-section shown in FIG. 8, the second through-hole 45 of the support 40 may have a second wall 49*a* nearest to the outermost circumference first through-hole 39. In the illustrated example, the second wall 49*a* may have an apex 49*b*. The second wall 49*a* may be inclined with respect to both the plane direction of the support 40 and the normal direction N thereof, such that the second wall 49*a* separates away from the outermost circumference first through-hole 39 in the plane direction of the support 40 (the right and left direction in FIG. 8), as it comes close to the first surface 40*a* of the support 40 from an apex 49*b*. In addition, the second wall 49*a* may be inclined with respect to both the plane direction of the support 40 and the normal direction N thereof, such that the second wall 49*a* separates away from the outermost circumference first through-hole 39 in the plane direction of the support 40, as it comes close to the second surface 40*b* of the support 40 from an apex 49*b*. Thus, in the illustrated example, the apex 49*b* may form the outline 45*a* of the second through-hole 45 in a plan view.

In the first cross-section shown in FIG. 8, the second through-hole 45 may have, in the first cross-section, a first surface side connection part 49*a*1 that connects a second wall 49*a* nearest to the outermost circumference first through-hole 39 and the first surface 40*a* of the support 40. When a clear apex is found at a part where the second wall 49*a* and the first surface 40*a* are connected, the apex may be regarded as the first surface side connection part 49*a*1. On the other hand, when no clear apex is found at a part where the second wall 49*a* and the first surface 40*a* are connected, a part of the second wall 49*a*, which is distant from the first surface 40*a* along the thickness direction (normal direction) of the support 40 by 5% of the dimension of the thickness of the support 40, may be regarded as the first surface side connection part 49*a*1.

In the first cross-section shown in FIG. 8, the second through-hole 45 may have a second surface side connection part 49*a*2 that connects the second wall 49*a* and the second surface 40*b* of the support 40. When a clear apex is found at a part where the second wall 49*a* and the second surface 40*b* are connected, the apex may be regarded as the second surface side connection part 49*a*2. On the other hand, when no clear apex is found at a part where the second wall 49*a* and the second surface 40*b* are connected, a part of the second wall 49*a*, which is distant from the second surface 40*b* along the thickness direction (normal direction) of the support 40 by 5% of the dimension of the thickness of the support 40, may be regarded as the second surface side connection part 49*a*2.

In the first cross-section shown in FIG. 8, a straight line L3 of straight lines passing the second surface side connection part 40*a*2 and a given point on the second wall 49*a*, the straight line L3 having a largest angle with respect to the normal direction N of the support 40, is considered. An angle defined between the straight line L3 and the normal direction N is θ3. The angle θ3 is preferably not less than 20 degrees and not more than 60 degrees. When the angle θ3 is not less than 20 degrees, the opening area of the second through-hole 45 on the second surface 40*b* side can be enlarged, whereby generation of shadow can be more effectively prevented. On the other hand, when the angle θ3 is not more than 60 degrees, the thickness of the support 40 can be sufficiently ensured at a part near the outermost circumference first through-hole 39, whereby the mask body 30 can be appropriately supported by the support 40, so that generation of a space between the mask body 30 and the substrate to be deposited 92 can be prevented.

In the illustrated example, the second surface side connection part 49*a*2 may be located nearer to the second side than the first surface side connection part 49*a*1. In other words, the second surface side connection part 49*a*2 may be located on a side more distant from the outermost circumference first through-hole 39 than the first surface side connection part 49*a*1 in the plane direction of the support 40. Thus, while the opening area of the second through-hole 45 on the second surface 40*b* side can be enlarged, the thickness of the support 40 can be sufficiently ensured at a part near the outermost circumference first through-hole 39. Thus, while preventing generation of shadow, the mask body 30 can be appropriately supported by the support 40, so that generation of a space between the mask body 30 and the substrate to be deposited 92 can be prevented.

In addition, in the illustrated example, the apex 49b of the support 40 may be located nearer to the first surface 40a side (mask body 30 side) than a center in the thickness direction of the support 40 in the normal direction N. In other words, a distance D1 between the second point P2 and the first surface 40a of the support 40 along the normal direction N of the support 40 may be smaller than a distance D2 between the second point P2 and the second surface 40b of the support 40 along the normal direction N of the support 40. This also allows that the opening area of the second through-hole 45 is enlarged, as well as that the thickness of the support 40 can be sufficiently ensured at a part near the outermost circumference first through-hole 39. Thus, while preventing generation of shadow, the mask body 30 can be appropriately supported by the support 40, so that generation of space between the mask body 30 and the substrate to be deposited 92 can be prevented.

Further, in the cross-section shown in FIG. 8, it is not necessary that the straight line L1 and the straight line L3 intersect within the thickness range of the support 40 in the normal direction N. Namely, an intersection point of the straight line L1 and the strain line L3 may be outside the thickness of the support 40 in the normal line N, or the straight line L1 and the straight line L3 may be parallel to each other. In other words, it is not necessary that the straight line L1 and the straight line L3 intersect between the first surface 40a and the second surface 40b of the support 40. This also allows that the opening area of the second through-hole 45 can be enlarged, as well as that the thickness of the support 40 can be sufficiently ensured at a part near the outermost circumference first through-hole 39. Thus, while preventing generation of shadow, the mask body 30 can be appropriately supported by the support 40, so that generation of space between the mask body 30 and the substrate to be deposited 92 can be prevented.

Next, a method of manufacturing the deposition mask apparatus 10 is described. A method of manufacturing the deposition mask 20 of the deposition mask apparatus 10 is firstly described.

Firstly, a mask body 30 joined to a base member 51, which has a metal layer 31 in which two or more first through-holes 35 are formed, may be prepared. At this time, the base member 51 may be firstly prepared. A material forming the base member 51 and a thickness of the base member 51 are not specifically limited, as long as they offer an insulation property and a suitable strength. As described below, when the mask body 30 and the support 40 are welded and fixed by laser beam irradiation through the base member 51, a glass material having a high light transmissivity may be suitably used as a material forming the base member 51. Alternatively, when the mask body 30 and the support 40 are fixed to each other by using an adhesive, glass, synthetic resin or metal can be used as a material for forming the base member 51. In this case, the base member 51 may not have light transmissivity. Herein, an example in which a glass material having a high light transmissivity is used as the base member 51 is described.

Figure 9A:
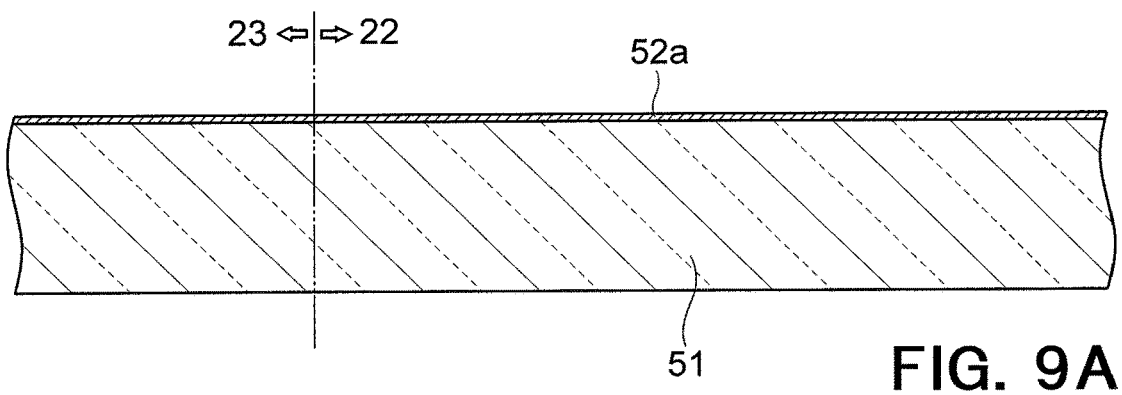
FIG. 9A is a view showing a step of an example of a manufacturing method of a pattern substrate used for manufacturing a mask body.

As shown in FIG. 9A, a conductive layer 52a made of a conductive material may be formed on the base member 51. The conductive layer 52a may be a layer that is patterned so as to serve as a conductive pattern 52, which is described later. A conductive material such as a metal material or an oxide conductive material may suitably be used as a material forming the conductive layer 52a. For example, a metal material may be chromium or copper. Preferably, a material having a high bonding property to the below-described first resist pattern 53 may be used as a material forming the conductive layer 52a. For example, when the first resist pattern 53 is produced by patterning a so-called dry film, such as a resist film containing an acryl-based photosetting resin, copper may be used as a material forming the conductive layer 52a.

The conductive layer 52a may be formed by sputtering or electroless plating, for example. When the thick conductive layer 52a is formed, a long period of time is needed to form the conductive layer 52a. On the other hand, when the thickness of the conductive layer 52a is excessively small, a resistance value increases so that it is difficult to form the first metal layer 32 by electrolytic plating.

For example, a thickness of the conductive layer 52a may be not less than 50 nm, not less than 100 nm, not less than 150 nm, or not less than 200 nm. In addition, for example, the thickness of the conductive layer 52a may be not more than 300 nm, not more than 400 nm, not more than 450 nm, or not more than 500 nm. A range of the thickness of the conductive layer 52a may be determined form a first group consisting of 50 nm, 100 nm, 150 nm, and 200 nm, and/or a second group consisting of 300 nm, 400 nm, 450 nm, and 500 nm. The thickness of the conductive layer 52a may be determined by combining a given value of the values included in the aforementioned first group, and a given value of the values included in the aforementioned second group. The range of the thickness of the conductive layer 52a may be determined by combining two given values of the values included in the aforementioned first group. The range of the thickness of the conductive layer 52a may be determined by combining two given values of the values included in the aforementioned second group. The range of the thickness of the conductive layer 52a may be not less than 50 nm and not more than 500 nm, not less than 50 nm and not more than 450 nm, not less than 50 nm and not more than 400 nm, not less than 50 nm and not more than 300 nm, not less than 50 nm and not more than 200 nm, not less than 50 nm and not more than 150 nm, not less than 50 nm and not more than 100 nm, not less than 100 nm and not more than 500 nm, not less than 100 nm and not more than 450 nm, not less than 100 nm and not more than 400 nm, not less than 100 nm and not more than 300 nm, not less than 100 nm and not more than 200 nm, not less than 100 nm and not more than 150 nm, not less than 150 nm and not more than 500 nm, not less than 150 nm and not more than 450 nm, not less than 150 nm and not more than 400 nm, not less than 150 nm and not more than 300 nm, not less than 150 nm and not more than 200 nm, not less than 200 nm and not more than 500 nm, not less than 200 nm and not more than 450 nm, not less than 200 nm and not more than 400 nm, not less than 200 nm and not more than 300 nm, not less than 300 nm and not more than 500 nm, not less than 300 nm and not more than 450 nm, not less than 300 nm and not more than 400 nm, not less than 400 nm and not more than 500 nm, not less than 400 nm and not more than 450 nm, or not less than 450 nm and not more than 500 nm.

Figure 9B:
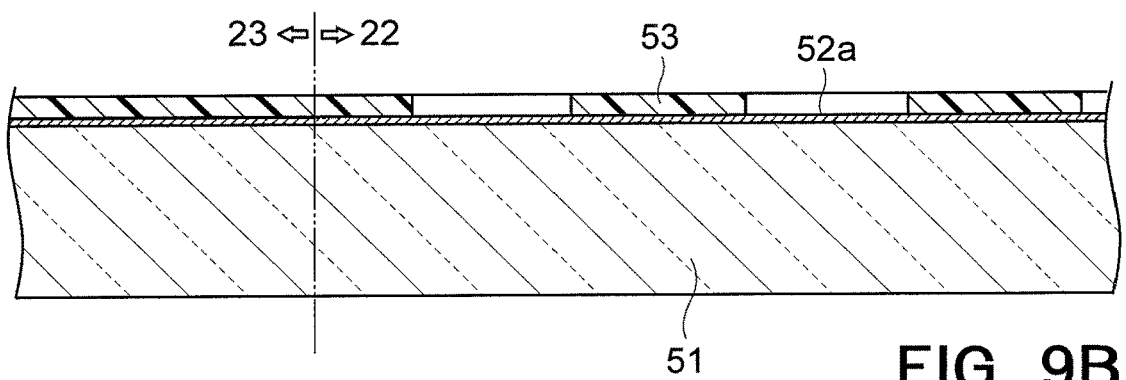
FIG. 9B is a view showing a step of an example of the manufacturing method of a pattern substrate used for manufacturing a mask body.
Figure 9C:
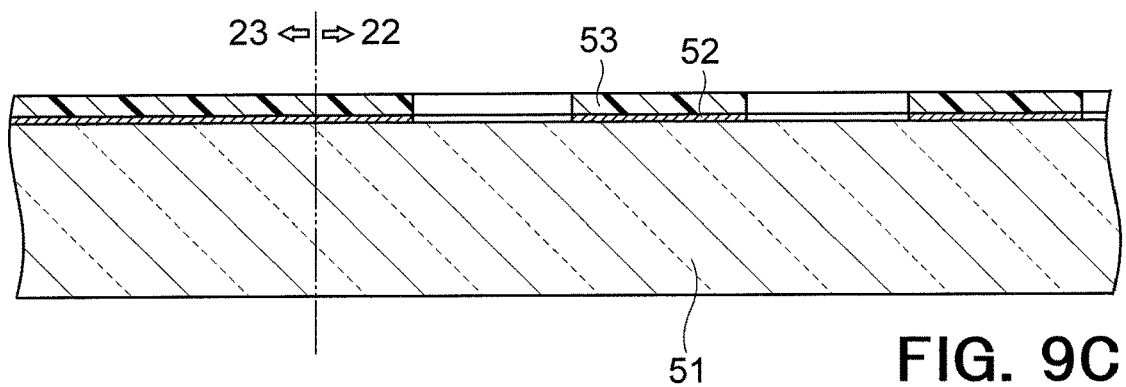
FIG. 9C is a view showing a step of an example of the manufacturing method of a pattern substrate used for manufacturing a mask body.
Figure 9D:
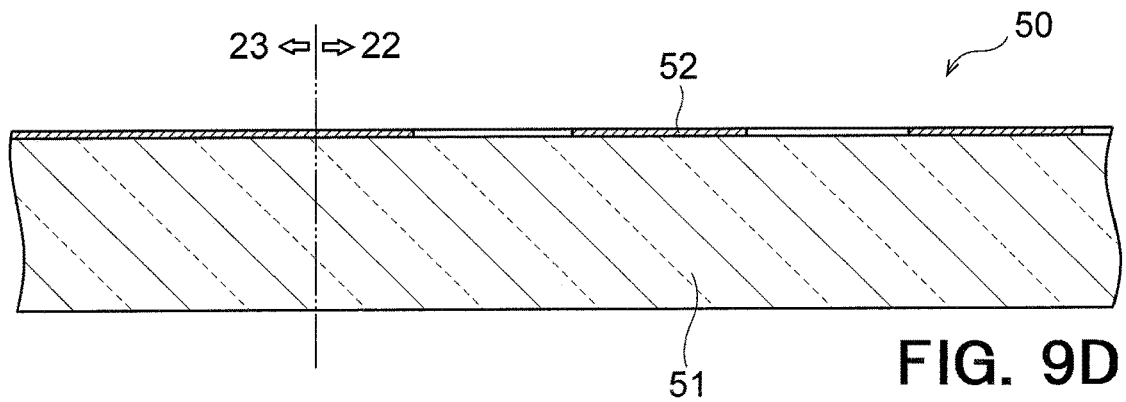
FIG. 9D is a view showing a step of an example of the manufacturing method of a pattern substrate used for manufacturing a mask body.

Then, as shown in FIG. 9B, a first resist pattern 53 having a predetermined pattern may be formed on the conductive layer 52a. Similarly to the case of a second resist pattern 55 which will be described below, a photolithographic method can be employed as the method of forming the first resist pattern 53. As a method of irradiating the material for the first resist pattern 53 with light in a predetermined pattern, a method of using an exposure mask that allows exposure light to transmit therethrough in a predetermined pattern, or a method that relatively scans the material for the first resist pattern 53 with exposure light in a predetermined pattern may be employed. Thereafter, as shown in FIG. 9C, a part of the conductive layer 52a, which is not covered with the first resist pattern 53, may be removed by etching. Then, as shown in FIG. 9D, the first resist pattern 53 may be removed. Thus, a pattern substrate 50, in which the conductive pattern 52 having a pattern corresponding to the first metal layer 32 is formed, can be obtained.

Then, a metal layer 31 may be precipitated on the conductive pattern 52 by using the base member 51 (pattern substrate 50) on which the predetermined conductive pattern 52 has been formed beforehand.

Figure 10A:
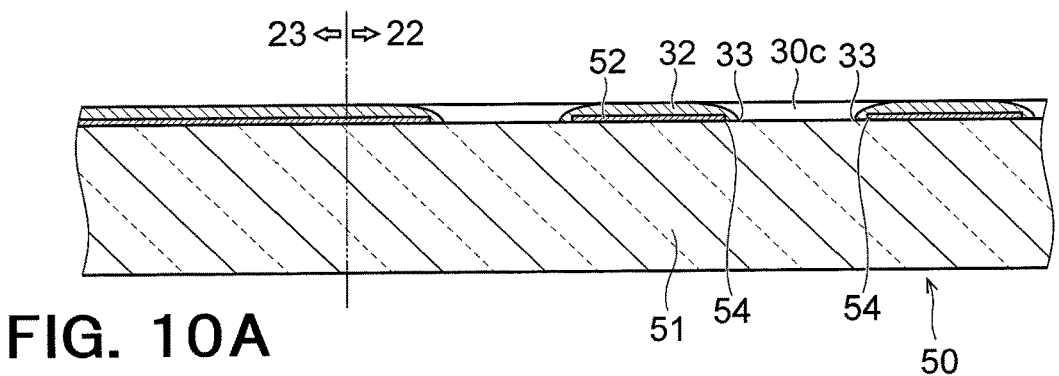
FIG. 10A is a view showing a step of an example of a manufacturing method of a mask body.

A step in which the aforementioned metal layer 32 is formed by using the pattern substrate 50 is firstly described. In this step, a first metal layer 32 having first openings 30c in a predetermined pattern may be formed on the base member 51 having an insulation property. To be specific, a first plating process in which a first plating solution is supplied onto the base member 51 on which the conductive pattern 52 is formed, so that a first metal layer 32 is precipitated on the conductive pattern 52, may be performed. For example, the base member 51 on which the conductive pattern 52 may be immersed into a plating bath filled with the first plating solution. Thus, as shown in FIG. 10A, the first metal layer 32 in which the first openings 30c are provided in a predetermined pattern can be obtained on the base member 51. A thickness of the first metal layer 32 may be not more than 5 μm, for example. The fact that the first metal layer 32 is formed on the base member 51 is not limited to the fact that the first metal layer 32 is formed directly on the base member 51, and includes the fact that the conductive metal layer 32 is formed on the base member 51 through another layer such as the conductive pattern 52.

As shown in FIG. 10A, because of the plating process properties, the first metal layer 32 may be formed not only on a part overlapped with the conductive pattern 52 but also on a part not overlapped with the conductive pattern 52, when seen along the normal direction of the base member 51. This is imagined because the first metal layer 32 is further precipitated on a surface of the first metal layer 32 precipitated on a part in contact with an end 54 of the conductive pattern 52. As a result, as shown in FIG. 10A, when seen along the normal direction of the base member 51, an end 33 of the first pattern 30c may be located at a part not overlapped with the conductive pattern 52.

A specific method of the first plating step is not particularly limited, as long as the first metal layer 32 can be precipitated on the conductive pattern 52. For example, the first plating step may be performed as a so-called electrolytic plating step in which a current is applied to the conductive pattern 52 so as to precipitate the first metal layer 32 on the conductive pattern 52. Alternatively, the first plating step may be an electroless plating step. When the first plating step is an electroless plating step, a suitable catalyst layer may be provided on the conductive pattern 52. Alternatively, the conductive pattern 52 may be configured to function as a catalyst layer. Also when an electrolytic plating step is performed, a catalyst layer may be provided on the conductive pattern 52.

Ingredients of the first plating solution to be used may suitably be determined in accordance with properties required for the first metal layer 32. For example, as the first plating solution, a mixed solution of a solution containing nickel compounds and a solution containing iron compounds may be used. For example, a missed solution of a solution containing nickel sulfamate or nickel bromide and a solution containing ferrous sulfamate may be used. The plating solution may contain various additives. Examples of additives that can be used include pH buffers such as boric acid, primary brighteners such as saccharin sodium, secondary brighteners such as butynediol, propargyl alcohol, coumarin, formalin and thiourea, and antioxidants.

Figure 10B:
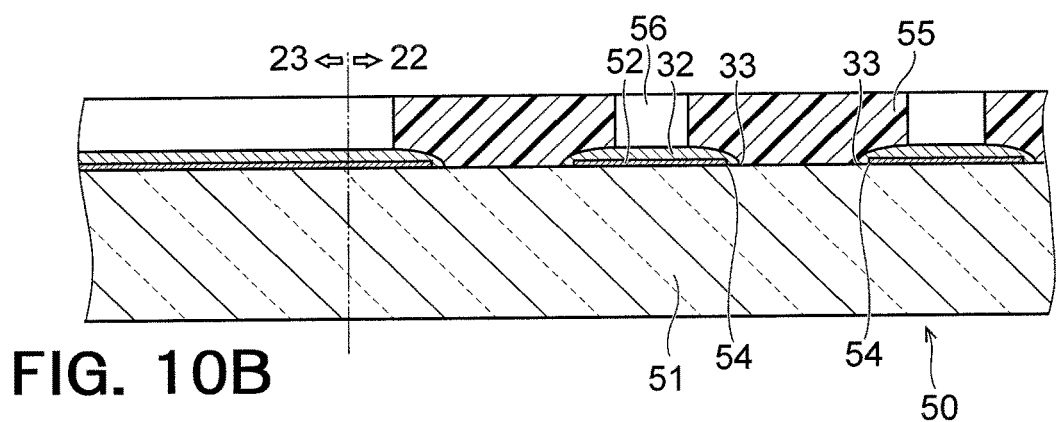
FIG. 10B is a view showing a step of an example of the manufacturing method of the mask body.

Then, a step in which a second metal layer 37 having second openings 30d to be in communication with the first openings 30c is formed on the first metal layer 32, may be performed. At this time, a second resist pattern 55 with a predetermined gap 56 may be formed on the base member 51 and the first metal layer 32. FIG. 10B is a cross-sectional view showing the second resist pattern 55 formed on the base member 51. As shown in FIG. 10B, the resist forming step may be performed such that the first opening 30c of the first metal layer 32 is covered with the second resist pattern 55, and that the gap 56 of the second resist pattern 55 is positioned above the first metal layer 32.

Herebelow, an example of the resist forming step is described. Firstly, a negative-type resist film may be formed by attaching a dry film on the base member 51 and the first metal layer 32. An example of the dry film may be a dry film containing an acryl-based photosetting resin, such as RY3310 manufactured by Hitachi Chemical Co., Ltd. Alternatively, the resist film may be formed by applying a material for the second resist patter 55 and then by performing a baking process according to need. Then, an exposure mask which does not allow light to transmit through an area of the resist film, which is to become the gap 56, may be prepared, and the exposure mask may be disposed on the resist film. Thereafter, the exposure mask may be brought into sufficient contact with the resist film by vacuum contact. A positive-type resist film may be used as the resist film. In this case, an exposure mask that allows light to transmit an area of the resist film, which is to be removed, may be used.

After that, the resist film may be exposed through the exposure mask. Further, the resist film may be developed in order to form an image on the exposed resist film. In order that the second resist pattern 55 is brought into contact with the base member 51 and the first metal layer 32 more tightly, a heating step for heating the second resist pattern 55 may be performed after the developing step.

Figure 10C:
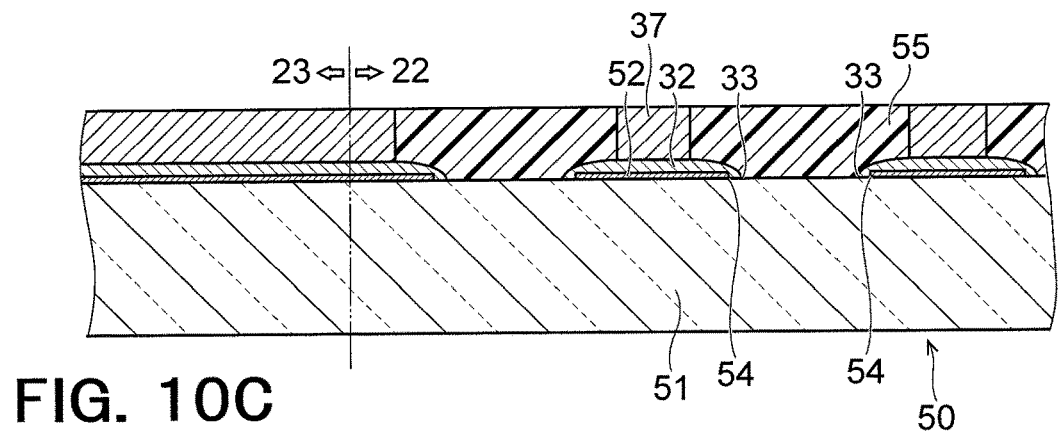
FIG. 10C is a view showing a step of an example of the manufacturing method of the mask body.

Then, the second metal layer 37 may be formed on the first metal layer 32. At this time, the second metal layer 37 having the second openings 30d to be in communication with the first openings 30c may be formed on the first metal layer 32. To be specific, a second plating solution may be supplied to the gap 56 of the second resist pattern 55 so as to precipitate the second metal layer 37 on the first metal layer 32. For example, the base member 51 with the first metal layer 32 formed thereon may be immersed into a plating bath filled with the second plating solution. Thus, as shown in FIG. 10C, the second metal layer 37 can be obtained on the first metal layer 32. A thickness of the second metal layer 37 may be set such that the thickness T0 (see FIG. 8) of the metal layer 31 of the deposition mask 20 in the effective area 22 is, e.g., not less than 2 μm and not more than 50 μm.

A specific method of the second plating step is not particularly limited, as long as the second metal layer 37 can be precipitated on the first metal layer 32. For example, the second plating step may be performed as a so-called electrolytic plating step in which a current is applied to the first metal layer 32 so as to precipitate the second metal layer 37 on the first metal layer 32. Alternatively, the second plating step may be an electroless plating step. When the first plating step is an electroless plating step, a suitable catalyst layer may be provided on the first metal layer 32. Also when an electrolytic plating step is performed, a catalyst layer may be provided on the first metal layer 32.

The same plating solution as the aforementioned first plating solution may be used as the second plating solution. Alternatively, a plating solution different from the first plating solution may be used as the second plating solution. When the composition of the first plating solution and the composition of the second plating solution are the same with each other, the composition of the metal forming the first metal layer 32 and the composition of the metal forming the second metal layer 37 are also the same with each other.

Although FIG. 10C shows an example in which the second plating process is performed until an upper surface of the second resist pattern 55 and an upper surface of the second metal layer 37 correspond to each other, the present disclosure is not limited thereto. The second plating process may be stopped, with the upper surface of the second metal layer 37 being located below the upper surface of the second resist pattern 55.

Figure 10D:
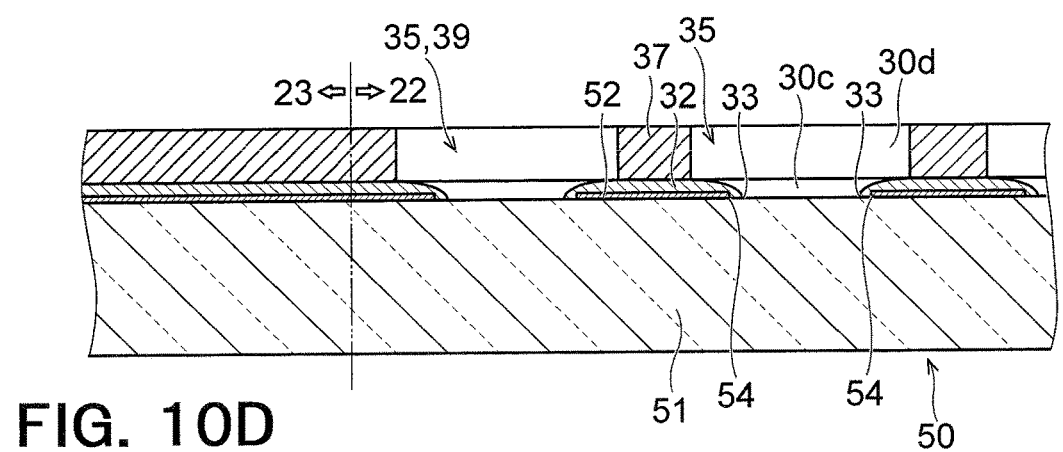
FIG. 10D is a view showing a step of an example of the manufacturing method of the mask body.

After that, a removal step in which the second resist pattern 55 is removed may be performed. The removal step may be performed by immersing a laminated body of the pattern substrate 50, the first metal layer 32, the second metal layer 37 and the second resist pattern 55, into an alkaline release agent, for example. Thus, as shown in FIG. 10D, the second resist pattern 55 may be released from the pattern substrate 50, the first metal layer 32 and the second metal layer 37. Thus, a mask body 30 joined to the base member 51 can be obtained. In addition, at this time, the second metal layer 37 having the second openings 30d in a predetermined pattern can be obtained on the first metal layer 32. Further, by communicating the first openings 30c and the second openings 30d, the first through-holes 35 passing through the mask body 30 may be formed. In this manner, by precipitating the metal layer 31 on the conductive pattern 52, the two or more first through-holes 35 may be formed.

Figure 11A:
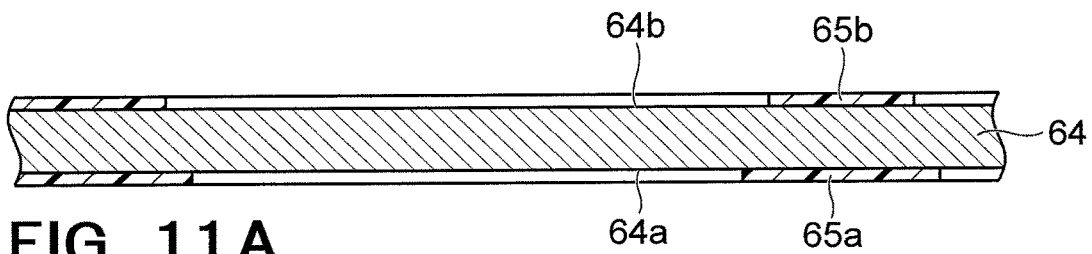
FIG. 11A is a view showing a step of an example of a manufacturing method of a support.

Simultaneously with the preparation step of the deposition mask 20 joined to the base member 51, a support 40 in which a second through-hole 45 is formed may be prepared. At this time, a resist film containing a photosensitive resist material may firstly be formed on a first surface 64a and a second surface 64b of a metal plate 64. Following thereto, the resist film may be exposed and developed. Thus, as shown in FIG. 11A, a first surface side resist pattern 65a can be formed on the first surface 64a of the metal plate 64, and a second surface side resist pattern 65b can be formed on the second surface 64b of the metal plate 64.

Figure 11B:
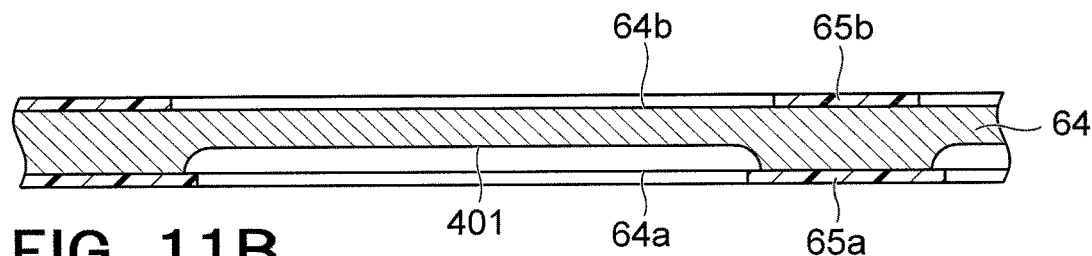
FIG. 11B is a view showing a step of an example of the manufacturing method of the support.

Then, as shown in FIG. 11B, a first surface etching step in which an area of the first surface 64a of the metal plate 64, which is not covered with the first surface side resist pattern 65a, is etched by means of a first etching solution, may be performed. Thus, a number of first recesses 401 may be formed in the first surface 64a of the metal plate 64. A ferric chloride solution or a solution containing hydrochloric acid may be used as the first etching solution, for example.

Figure 11C:
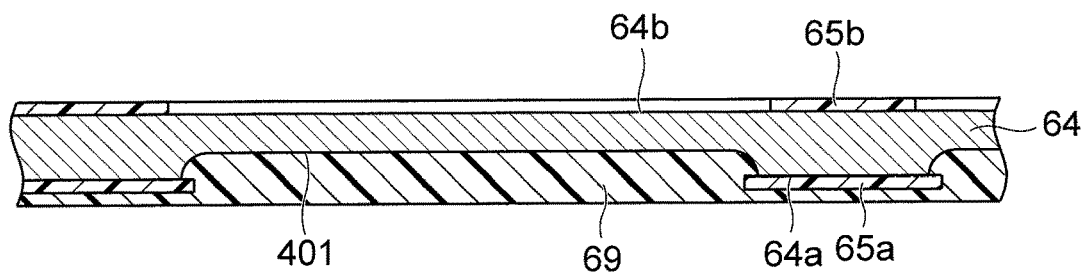
FIG. 11C is a view showing a step of an example of the manufacturing method of the support.

Thereafter, as shown in FIG. 11C, the thus formed first recesses 401 may be coated with a resin 69 having resistance properties to the etching solution. Namely, the first recesses 401 may be sealed with the resin 69. For example, a thermoplastic resin, which is heated and thus softened, may be supplied to the first surface side resist pattern 65a, and the thermoplastic resin may be embedded in the first recesses 401 through-holes formed in the first surface side resist pattern 65a, so that the first recesses 401 can be sealed with the resin 69. Alternatively, a dry film formed of a thermoplastic resin may be laminated on the first surface side resist pattern 65a, then the dry film may be heated so that the softened thermoplastic resin is embedded in the first surface side resist pattern 65a, whereby the first recesses 401 can be sealed with the resin 69. The step of sealing the first recesses 401 with the resin 69 may be performed under reduced pressure such as vacuum. By sealing the first recesses 401 with the resin 69 under reduced pressure, bubbles can be prevented from remaining in the first recesses 41. The film of the resin 69 may be formed to cover not only the first recesses 401 but also the first surface side resist pattern 65a.

Figure 11D:
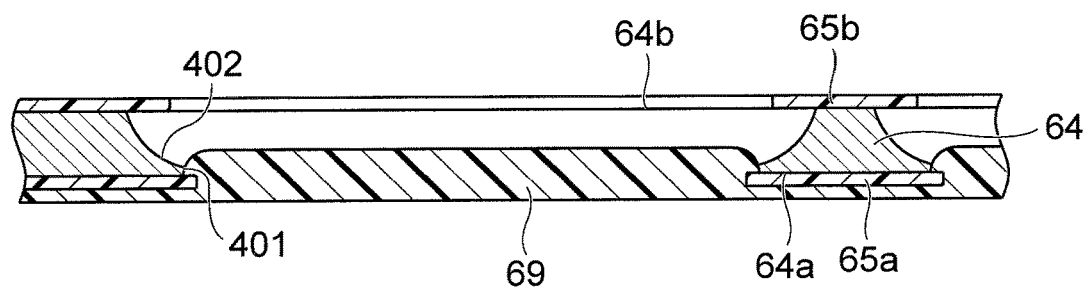
FIG. 11D is a view showing a step of an example of the manufacturing method of the support.

Then, as shown in FIG. 11D, a second surface etching step in which an area of the second surface 64b of the metal plate 64, which is not covered with the second surface side resist pattern 65b, is etched so as to form second recesses 402 in the second surface 64b, may performed. The second surface etching step may be performed until the first recesses 401 and the second recesses 402 communicate with each other so that second through-holes 45 are formed. Similarly to the aforementioned first etching solution, a ferric chloride solution or a solution containing hydrochloric acid may be used as the second etching solution, for example.

Figure 11E:
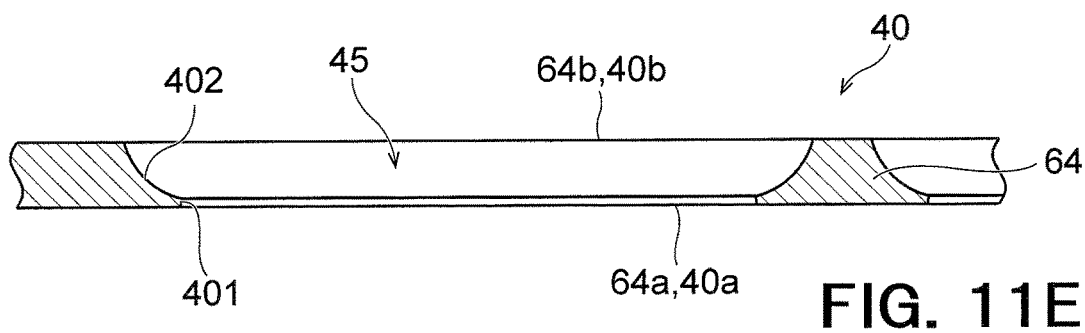
FIG. 11E is a view showing a step of an example of the manufacturing method of the support.

Thereafter, the resin 69 may be removed from the metal plate 64. The resin 69 may be removed by means of alkaline release solution. The resist patterns 65a, 65b may be removed simultaneously with the resin 69. However, after the resin 69 has been removed, a release solution different from the release solution for releasing the resin 69 may be used to remove the resist patterns 65a 65b separately from the resin 69. Thus, as shown in FIG. 11E, the support 40 in which the second through-holes 45 are formed can be obtained.

The thickness T1 (see FIG. 8) of such a support 40 may be, e.g., not less than 0.05 mm and not more than 3 mm. When the thickness T1 of the support 40 is not less than 0.05 mm, the rigidity of the deposition mask 20 can be improved. Thus, the mask body 30 can be prevented from being wrinkled or deformed. On the other hand, when the thickness T1 of the support 40 is not more than 3 mm, in a step of peeling a base member 51 from the mask body 30 joined to the support 40 as described below, it can be prevented that the base member 51 cannot be peeled therefrom.

In addition, the modulus of rigidity G of the support 40 may be not less than 50 GPa and not more than 65 GPa. When the modulus of rigidity of the support 40 is not less than 50 GPa, the rigidity of the deposition mask 20 can be effectively improved. Thus, the mask body 30 can be prevented from being wrinkled or deformed. On the other hand, when the modulus of rigidity of the support 40 is not more than 65 GPa, in a step of peeling a base member 51 from the mask body 30 joined to the support 40, it can be prevented that the base member 51 cannot be peeled therefrom. As a material forming the support 40, an iron alloy that is an invar material containing not less than 34% by mass and not more than 38% by mass of nickel, or a super invar material containing cobalt in addition to nickel may be used.

Figure 12A:
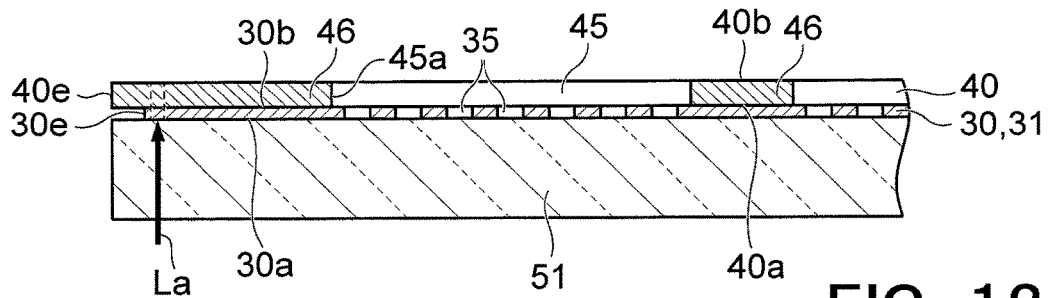
FIG. 12A is a view showing a step of an example of a manufacturing method of a deposition mask.

Then, a joint step in which the mask body 30 and the support 40 are joined may be performed. In the joint step, the support 40 and the mask body 30 may be joined to each other, such that the second through-holes 45 of the support 40 are overlapped with the first through-holes 35 of the mask body 30 in a plan view. At this time, the mask body 30 may firstly be disposed on the support 40. Then, as shown in FIG. 12A, the mask body 30 may be irradiated with a laser beam La from the base member 51 side through the base member 51 to melt a part of the second metal layer 37 and a part of the support 40 by heat generated by the irradiation of the laser beam La, so that the mask body 30 and the support 40 are joined to each other by welding. For example, a YAG laser beam generated by a YAG laser system may be used as the laser beam La. For example, as a YAG laser system, a system including a crystal of YAG (yttrium aluminum garnet) doped with Nd (neodymium) as an oscillation medium may be used.

Figure 12B:
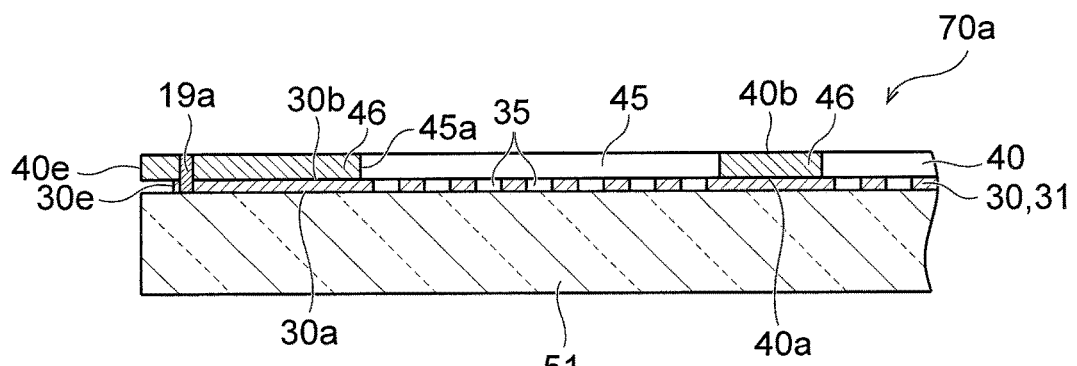
FIG. 12B is a view showing a step of an example of the manufacturing method of the deposition mask.

Thus, as shown in FIG. 12B, a first joint 19a that joins the mask body 30 and the support 40 is formed, so that a first intermediate member 70a having the mask body 30 joined to the substrate 51, and the support 40 joined to the mask body 30 can be obtained. However, not limited thereto, the mask body 30 and the support 40 may be joined to each other by another fixing means such as an adhesive. Alternatively, the mask body 30 and the support 40 may be joined to each other by a plating process.

Figure 12C:
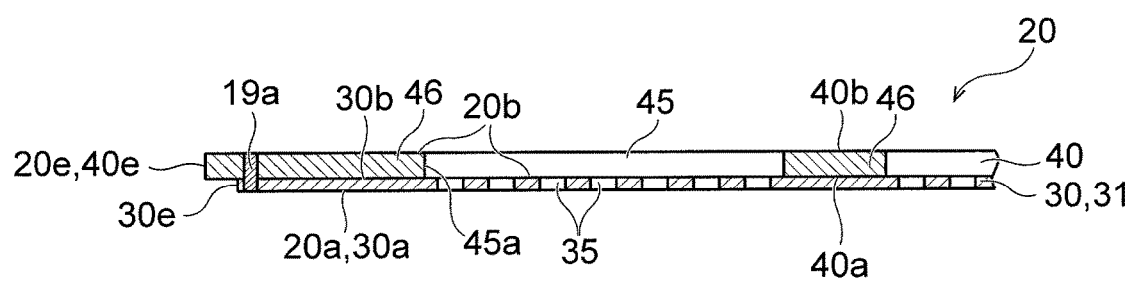
FIG. 12C is a view showing a step of an example of the manufacturing method of the deposition mask.

Then, a peeling step in which the substrate 51 is peeled from the mask body 30 of the first intermediate member 70a may be performed. Thus, as shown in FIG. 12C, a deposition mask 20 comprising the mask body 30 having the metal layer 31 in which the two or more first through-holes 35 are formed, and the support 40 joined to the mask body 30, the support 40 having the second through-holes 45 which are overlapped with the two or more first through-holes 35 in a plan view, can be obtained.

At this time, as described above, the thickness T1 of the support 40 may be not more than 3 mm. Thus, in the step of peeling the base member 51 from the mask body 30 of the first intermediate member 70a, it can be prevented that the base member 51 cannot be peeled therefrom. Namely, when the base member 51 is peeled from the mask body 30, the base member 51 may be peeled while elastically deforming the mask body 30 lest the mask body 30 is wrinkled and/or plastically deformed. On the other hand, when the thickness T1 of the support 40 is excessively large, the rigidity of the first intermediate member 70a becomes excessively larger so that there is a possibility that the mask body 30 is difficult to be elastically deformed. However, since the thickness T1 of the support 40 is not more than 3 mm, the rigidity of the first intermediate member 70a can be prevented from becoming too large, whereby the mask body 30 can be suitably deformed plastically. As a result, when the base member 51 is peeled form the mask body 30 of the first intermediate member 51, it can be prevented that the base member 51 cannot be peeled therefrom.

Next, a method of manufacturing the deposition mask apparatus 10 is described.

Firstly, the deposition mask 20 may be produced by the method described above with reference to FIGS. 9A to 12C, for example.

Figure 13:
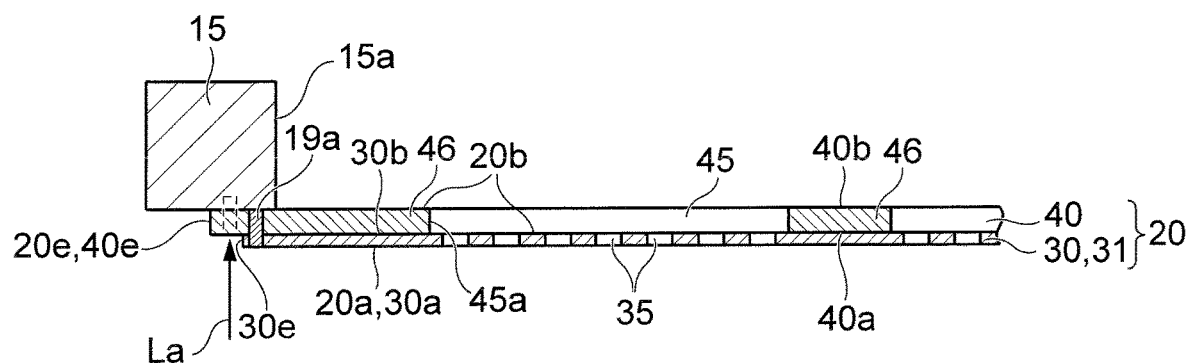
FIG. 13 is a view showing a step of an example of a manufacturing method of the deposition mask apparatus.

Then, the deposition mask 20 may be joined to the frame 15. In this case, the frame 15 and the support 40 may be joined to each other such that an opening 15a of the frame 15 is overlapped with the second through-hole 45 of the support 40 in a plan view. At this time, the deposition mask 20 may be disposed on the frame 15 such that the support 40 and the frame 15 are in contact with each other. Then, as shown in FIG. 13, the support 40 may be irradiated with a laser beam La to melt a part of the support 40 and a part of the frame 15 by heat generated by the irradiation of the laser beam La, so that the support 40 and the frame 15 are joined to each other by welding. At this time, in order to prevent the deposition mask 20 from being warped and to adjust the position of the effective area 22 of the mask body 30, the support 40 and the frame 15 may be joined to each other while the deposition mask 20 is pulled in its planar direction.

Thus, the second joints 19b that join the support 40 and the frame 15 are formed, and the deposition mask apparatus 10 as shown in FIG. 4, which comprises the deposition mask 20 and the frame 15 joined to the support 40 of the deposition mask 20 can be obtained. However, not limited thereto, the support 40 and the frame 15 may be joined to each other by another fixing means such as an adhesive.

Next, a deposition method of depositing the deposition material 98 onto the substrate to be deposited 92 by using the deposition mask 20 according to this embodiment is described. Firstly, the deposition mask 20 may be prepared. Then, the deposition mask 20 may be disposed such that the deposition mask 20 is opposite to the substrate to be deposited 92. In the example shown in FIGS. 1 and 2, the deposition mask 20 may be fixed on the frame 15, and thus may be disposed as the deposition mask apparatus 10. At this time, the deposition mask 20 may be brought into tight contact with the substrate to be deposited 92 by using the magnet 93. Under this state, the substrate to be deposited 92, the deposition mask 20, the frame 15 and the magnet 93 may be loaded into the deposition apparatus 90. Thereafter, the atmosphere (air) in the deposition apparatus 90 is discharged by the exhaust means, not shown, so as to decompress the inside of the deposition apparatus 90. Then, the deposition material 98 may be evaporated to fly to the substrate to be deposited 92 through the deposition mask 20, so that the deposition material 98 is deposited onto the substrate to be deposited 92 in a pattern corresponding to the through-holes 25 of the deposition mask 2 (deposition step). After the deposition step has ended, an atmosphere may be introduced into the deposition apparatus 90 so that the inside of the deposition apparatus 90 returns to a normal pressure. Finally, the substrate to be deposited 92 with the deposition material 98 adhered thereto, the deposition mask 20, the frame 15 and the magnet 93 may be unloaded from the deposition apparatus 90. Then, the deposition mask 20 may be peeled from the substrate to be deposited 92, and the deposition mask 20, the frame 12 and the magnet 93 may be removed.

The deposition mask 20 in this embodiment is a deposition mask 20 comprising: a mask body 30 having two or more first through-holes 35; and a support 40 disposed on the mask body 30 and having a second through-hole 45 located at a position overlapped with the first through-holes 35 in a plan view; wherein: the mask body 30 has a first surface 30a located on an opposite side of a side of the support 40, and a second surface 30b located on the side of the support 40; an outermost circumference first through-hole 39, which is located on an outermost circumference in a plan view of the two or more first through-holes 35 located at the position overlapped with the second through-hole 45 in a plan view, includes a first point P1 which is a center of the outermost circumference first through-hole 39 in a plan view; the second through-hole 45 includes a second point P2 on an outline of the second through-hole 45, the second point P2 being nearest to the first point P1; the outermost circumference first through-hole 39 has a first wall 39a which is a wall on a side of the second point P2, in a first cross-section that is a plane which includes the first point P1 and the second point P2 and is parallel to a normal direction N of the mask body 30; the outermost circumference first through-hole 39 has a second surface side connection part 39a2 which connects the first wall 39a and the second surface 30b, in the first cross-section; and the support 40 is located on a second side which is an opposite side of a first side which is a center side of the second through-hole 45 in a plane direction of the support 40, with respect to a straight line L1 of straight lines passing the second surface side connection part 39a2 and a given point on the first wall 39a in the first cross-section, the straight line L1 having a largest angle with respect to the normal direction of the mask body 40.

According to such a deposition mask 20, it can be effectively prevented that the course of the deposition material 98, which moves, at the largest angle θ1 with respect to the normal direction N, toward the substrate to be deposited 92 exposed into the outermost circumference first through-hole 39, is interfered with by the support 40 so that the deposition material 98 cannot appropriately adhere to the substrate to be deposited 92. Namely, generation of shadow can be effectively prevented.

In the deposition mask 20 in this embodiment, the support 40 has a first surface 40a located on a side of the mask body 30, and a second surface 40b located on an opposite side of the side of the mask body 30; the second through-hole 45 has a second wall 49a nearest to the outer circumference first through-hole 39, in the first cross-section; the second through-hole 45 has a second surface side connection part 49a2 which connects the second wall 49a and the second surface 40b of the support 40, in the first cross-section; and in the first cross-section, a largest angle θ3 of a straight line passing the second surface side connection part 49a2 of the second through-hole 45 and a given point on the second wall 49a, with respect to the normal direction N of the support 40, is not less than 20 degrees and not more than 60 degrees.

According to such a deposition mask 20, since the angle θ3 is not less than 20 degrees, the opening area of the second through-hole 45 on the second surface 40b side can be enlarged, whereby generation of shadow can be more effectively prevented. In addition, since the angle θ3 is not more than 60 degrees, the thickness of the support 40 can be sufficiently ensured at a part near the outermost circumference first through-hole 39, whereby the mask body 30 can be appropriately supported by the support 40, so that generation of a space between the mask body 30 and the substrate to be deposited 92 can be prevented.

In the deposition mask 20 in this embodiment, the support 40 has a thickness T1 not less than 0.05 mm and not more than 3 mm.

According to such a deposition mask 20, since the support 40 has a thickness T1 of not less than 0.05 mm, the rigidity of the deposition mask 20 can be improved. Thus, the mask body 30 can be prevented from being wrinkled and/or deformed. In addition, since the support 40 has the thickness T1 of not more than 3 mm, in a step of peeling a base member 51 from the mask body 30 joined to the support 40 as described below, it can be prevented that the base member 51 cannot be peeled therefrom.

In the deposition mask 20 in this embodiment, the mask body 30 contains metal.

According to such a deposition mask 20, the strength of the mask body 30 can be improved. Thus, the mask body 30 can be prevented from being wrinkled and/or deformed.

In the deposition mask 20 in this embodiment, the support 40 contains metal.

According to such a deposition mask 20, the strength of the support 40 can be improved. Thus, in the deposition step, the mask body 30 can be appropriately supported by the support 40.

In the deposition mask 20 in this embodiment, the mask body 30 and the support 40 contain metal.

According to such a deposition mask 20, the strength of the mask body 30 and the support t40 can be improved. Namely, the strength of the deposition mask 20 as a whole can be improved. Thus, in the deposition step, the mask body 30 can be appropriately supported by the support 40, and the mask body 30 can be prevented from being wrinkled and/or deformed.

In the deposition mask 20 in this embodiment, a distance between the second point P2 and the first surface 40a of the support 40 along the normal direction N of the support 40 is smaller than a distance between the second point P2 and the second surface 40b of the support 40 along the normal direction of the support 40.

In addition, in the deposition mask 20 in this embodiment, the second surface side connection part 49a2 of the second through-hole 45 is located on the second side in the plane direction of the support 40, with respect to the first surface side connection part 49a1 of the second through-hole 45.

According to such a deposition mask 20, while the opening area of the second through-hole 45 on the second surface 40b side can be enlarged, the thickness of the support 40 can be sufficiently ensured at a part near the outermost circumference first through-hole 39. Thus, while preventing generation of shadow, the mask body 30 can be appropriately supported by the support 40, so that generation of a space between the mask body 30 and the substrate to be deposited 92 can be prevented.

The aforementioned embodiment can be variously modified. Herebelow, modification examples are described with reference to the drawings according to need. In the below description and the drawings used in the below description, a part that can be similarly constituted to the above embodiment has the same symbol as that of corresponding part the above embodiment, and overlapped description is omitted. In addition, when the effect obtained by the aforementioned embodiment is apparently obtained in the modification examples, description thereof is possibly omitted.

Figure 14:
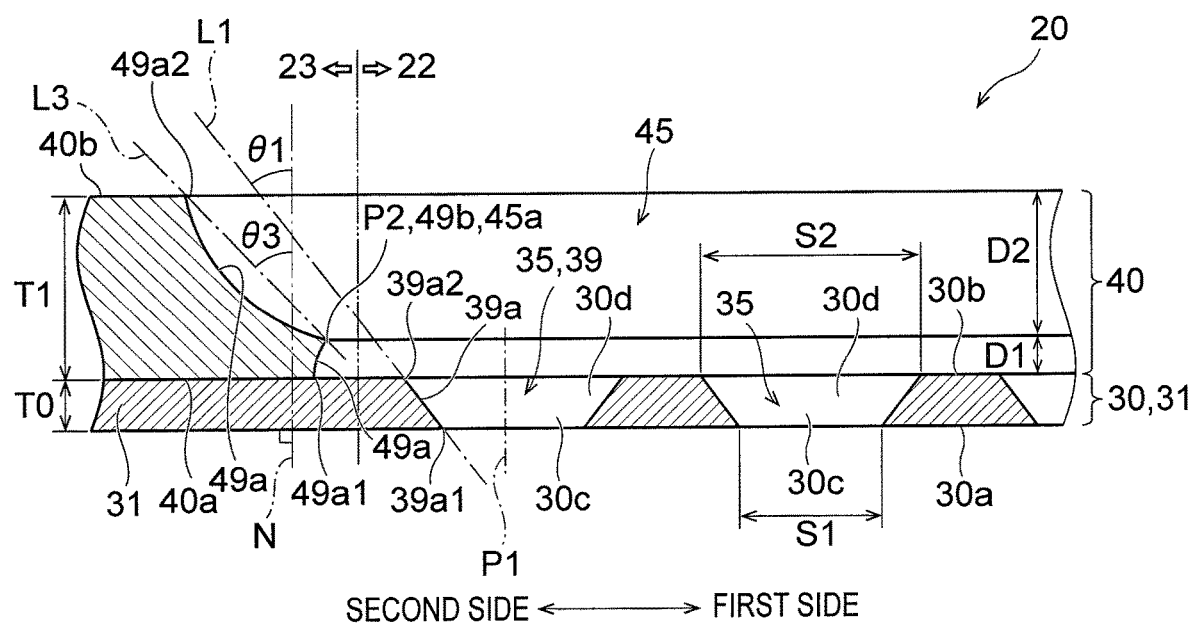
FIG. 14 is a cross-sectional view showing a modification example of the deposition mask.

FIG. 14 is a view corresponding to FIG. 8, which is a cross-sectional view showing a modification example of the deposition mask 20. A mask body 30 according to this modification example may be formed of one metal layer 31 in which two or more first through-holes 35 are formed in a predetermined pattern. In this modification example, a part of the first through-hole 35 extending from a first surface 30a of the mask body 30 to reach a second surface 30b, which is positioned on the first surface 30a side, may be a first opening 30c, and a part of the first through-hole 35, which is positioned on the second surface 30b side, may be a second opening 30e.

A manufacturing method of the mask body 30 according to this modification example is described.

Figure 15A:
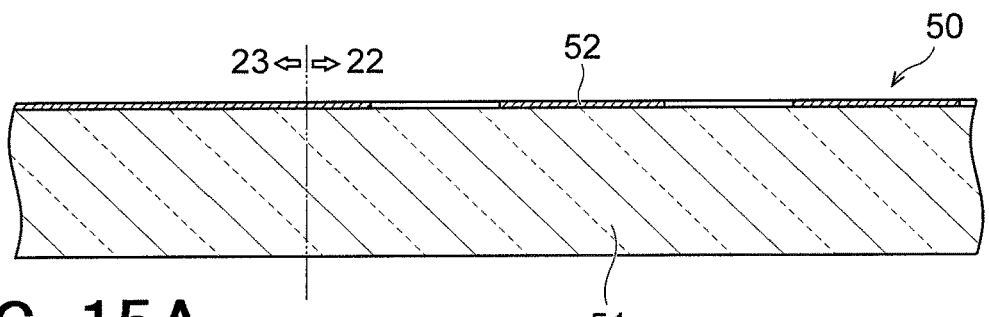
FIG. 15A is a view showing a step of an example of a manufacturing method of a mask body of the deposition mask of FIG. 14.
Figure 15B:
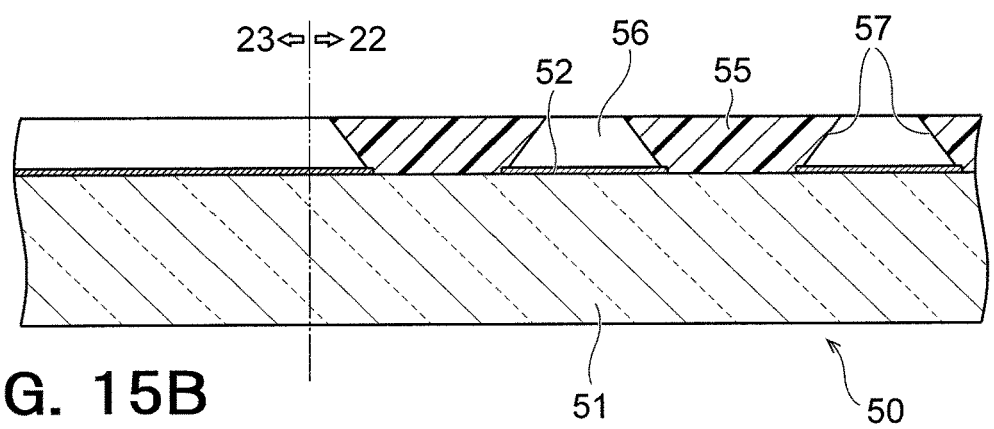
FIG. 15B is a view showing a step of an example of the manufacturing method of a mask body of the deposition mask of FIG. 14.
Figure 15C:
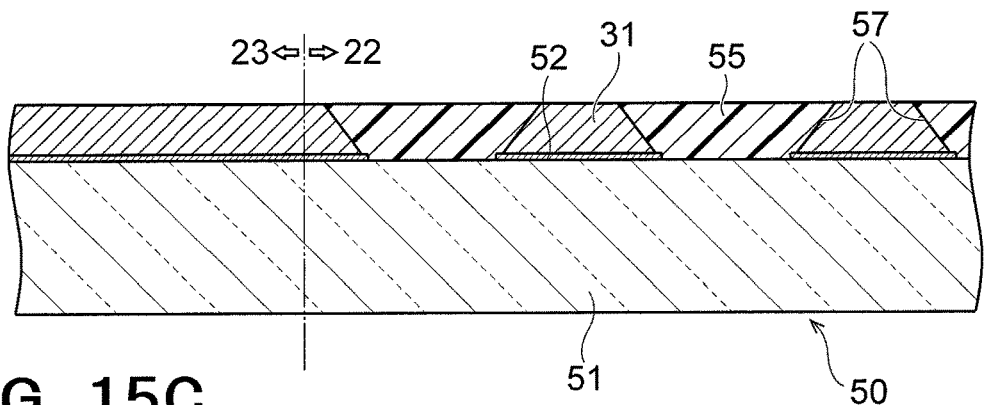
FIG. 15C is a view showing a step of an example of the manufacturing method of a mask body of the deposition mask of FIG. 14.

FIGS. 15A to 15C are views showing an example of the manufacturing method of the mask body 30 according to this modification example.

Firstly as shown in FIG. 15A, a base member 51 (pattern substrate 50) on which a predetermined conductive pattern 52 is formed may be prepared. The pattern substrate 50 may be produced by a method similar to the method described above with reference to FIGS. 9A to 9D.

Then, as shown in FIG. 15B, a resist forming step in which a second resist pattern 55 with a predetermined gap 56 is formed on the pattern substrate 50, may be performed. Preferably, a clearance between side surfaces 57 of the second resist pattern 55, which delimit the gap 56 of the second resist pattern 55, may narrow as the clearance separates from the base member 51. Namely, the second resist pattern 55 may have a so-called inverse tapered shape, in which a width of the second resist pattern 55 widens as the width separates away from the base member 51.

An example of forming such a second resist pattern 55 is described. For example, a resist film containing a photosetting resin may be firstly provided on a surface of the pattern substrate 50 on which the conductive pattern 52 is formed. Then, the resist film is exposed by irradiating the resist film with exposed light incident on the base member 51 from an opposite side of the base member 51 on which the resist film is provided. Thereafter, the resist film may be developed. In this case, based on a diffraction of the exposed light, the second resist pattern 55 having an inverse tapered shape as shown in FIG. 15B can be obtained.

Figure 15D:
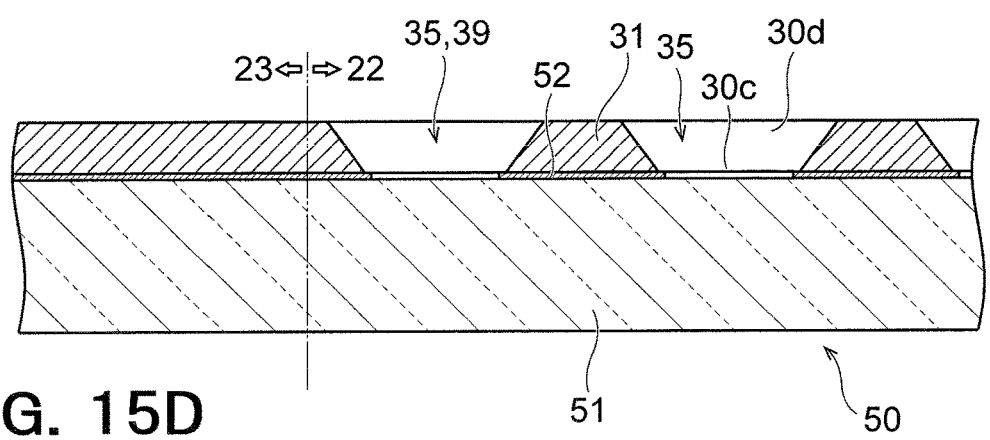
FIG. 15D is a view showing a step of an example of the manufacturing method of a mask body of the deposition mask of FIG. 14.

Then, as shown in FIG. 15C, a plating process in which the gap 56 of the second resist pattern 55 is supplied with a plating solution so as to precipitate a metal layer 31 on the conductive pattern 52, may be performed. Then, as shown in FIG. 15D, a removal step may be performed so as to remove the second resist pattern 55. Thereafter, by performing the separation step, the mask body 30 comprising a metal layer 31 provided with the first through-holes 35 in a predetermined pattern can be obtained.

FIG. 16 is a view for describing a second embodiment of the present disclosure. In the below description and the drawings used in the below description, a part that can be similarly constituted to the first embodiment has the same symbol as that of corresponding part the first embodiment, and overlapped description is omitted. In addition, when the effect obtained by the first embodiment is apparently obtained in the modification examples, description thereof is possibly omitted.

FIG. 16 is a view corresponding to FIG. 8, which is a sectional view showing a deposition mask 20 according to a second embodiment. A mask body 30 according to this embodiment may be formed of one layer in which two or more first through-holes 35 are formed in a predetermined pattern. The mask body 30 may have a first opening 30c and a second opening 30d in communication with the first opening 30c. In the illustrated example, the first opening 30c may be located on the first surface 30a side of the mask body 30, and the second opening 30d may be located on the second surface 30b side of the mask body 30. The first through-hole 35 may be formed by the first opening 30c and the second opening 30d which are in communication with each other.

In the illustrated example, a part of a first wall 39a of an outermost circumference first through-hole 39, the part delimiting the first opening 30c, may be inclined with respect to both a plane direction of the mask body 30 and a normal direction N thereof, such that the part separates away from a first point P1 of the outermost circumference first through-hole 39 in a plane direction of the mask body 30 (the right and left direction in FIG. 16), as it separates away from the first surface 30a of the mask body 30, i.e., as it separates away from the first surface side connection part 39a1. In addition, a part of the first wall 39a of the outermost circumference first through-hole 39, the part delimiting the second opening 30d, may be inclined with respect to both the plane direction of the mask body 30 and the normal direction N thereof, such that the part separates away from the first point P1 of the outermost circumference first through-hole 39 in the plane direction of the mask body 30, as it separates away from the first surface side connection part 39a1. Thus, the first surface side connection part 39a1 of the first wall 39a may define a part nearest to the first point P1. In other words, the first wall 39a may not have a part nearer to the first point P1 than the first surface side connection part 39a1. In the illustrated example, an angle of the part of the first wall 39a, which delimits the second opening 30d, with respect to the normal direction N, may be larger than an angle of the part of the first wall 39a, which delimits the first opening 30c, with respect to the normal direction N. The first through-hole 35 other than the outermost circumference first through-hole 39 may have a cross-sectional shape similar to the cross-sectional shape of the outermost circumference first through-hole 39.

In the cross-section shown in FIG. 16, a straight line L2 of straight lines passing the first side surface connection part 39a1 and a given point on the first wall 39a, the straight line L2 having a smallest angle with respect to the normal direction N of the mask body 30, is considered. An angle defined between the straight line L2 and the normal direction N is θ2.

When the outermost circumference first through-hole 39 has the shape shown in FIG. 16, the deposition material 98, which moves from the second surface 30b side of the mask body 30 at an angle not more than θ2 with respect to the normal direction N, can adhere to the substrate to be deposited 92 exposed into the outermost circumference first through-hole 39, without its course being interfered with by the mask body 30. On the other hand, there is a possibility that the deposition material 98, which moves from the second surface 30b side of the mask body 30 toward the outermost circumference first through-hole 39 at an angle larger than the angle θ2 with respect to the normal direction N, does not appropriately adhere to the substrate to be deposited 92 exposed into the outermost circumference first through-hole 39, because its course is interfered with by the deposition mask 30. In particular it is highly probable that the deposition material 98, which moves from the second surface 30b side of the mask body 30 toward the outermost circumference first through-hole 39 at an angle larger than the angle θ2 with respect to the normal direction N, the deposition material 98 moving toward a part near the first wall 39a of the substrate to be deposited 92 exposed into the outermost circumference first through-hole 39, is not appropriately adhere to the substrate to be deposited 92, because its course is interfered with by a part near the second surface side connection part 39a2 of the mask body 30.

Thus, the straight line L2 corresponds to a traveling direction of the deposition material 98 that can appropriately adhere to the substrate to be deposited 92 exposed into the outermost circumference first through-hole 39 at the largest angle with respect to the normal direction N. In order to allow the deposition material 98 moving in a direction inclined to the normal direction N to appropriately reach the substrate to be deposited 92 as much as possible without its course being interfered with by the mask body 30, a larger angle θ2 is advantageous. For example, the angle θ2 is preferably not less than 45°.

The support 40 may be positioned, in the plane direction of the support 40, on a second side which is an opposite side to a first side which is a center side of the second through-hole 45 in the first cross-section, with respect to the straight line L2. Preferably, the support 40 may be located only on the second side as compared with the straight line L2. Namely, the support 40 may be located only on a side separated from the outermost circumference first through-hole 39 as compared with the straight line L2 in the plane direction of the mask body 30. In this case, it can be effectively prevented that the course of the deposition material 98, which moves, at the largest angle θ2 with respect to the normal direction N, toward the substrate to be deposited 92 exposed into the outermost circumference first through-hole 39, is interfered with by the support 40 so that the deposition material 98 cannot appropriately adhere to the substrate to be deposited 92. Namely, generation of shadow can be effectively prevented.

In the deposition mask 20 in this embodiment, the support 40 may not be positioned beyond the straight line L2. In other words, the support 40 may not have a part beyond the straight line L2. In yet other words, the support 40 may not have a part that is in contact with the straight line L2. In this case, it can be effectively prevented that the course of the deposition material 98, which moves, at the largest angle θ2 with respect to the normal direction N, toward the substrate to be deposited 92 exposed into the outermost circumference first through-hole 39, is interfered with by the support 40 so that the deposition material 98 cannot appropriately adhere to the substrate to be deposited 92. Namely, generation of shadow can be effectively prevented.

As described above, in the deposition step, the deposition material 98, which moves toward the substrate to be deposited 92, not only moves along the normal direction N of the deposition mask 20, but also may move in a direction that is largely inclined with respect to the normal direction N of the deposition mask 20. In the deposition apparatus 90, when an angle defined between the traveling direction of the deposition material 98 and the normal direction N of the deposition mask 20 is controlled within a predetermined range, the angle θ2 is preferably set as an angle that is equal to a largest angle defined between the traveling direction of the deposition material 98 and the normal direction N of the deposition mask 20, or an angle that is larger than the largest angle.

A material forming the mask body 30 is not particularly limited, and metal or resin may be used, for example. By way of example, the mask body 30 can be manufactured by a method similar to a manufacturing method of a resin mask shown in JP5994952B.

The deposition mask 20 in this embodiment is a deposition mask 20 comprising: a mask body 30 having two or more first through-holes 35; and a support 40 disposed on the mask body 30 and having a second through-hole 45 located at a position overlapped with the first through-holes 35 in a plan view; wherein: the mask body 30 has a first surface 30a located on an opposite side of a side of the support 40, and a second surface 30b located on the side of the support 40; an outermost circumference first through-hole 39, which is located on an outermost circumference in a plan view of the two or more first through-holes 35 located at the position overlapped with the second through-hole 45 in a plan view, includes a first point P1 which is a center of the outermost circumference first through-hole 39 in a plan view; the second through-hole 45 includes a second point P2 on an outline of the second through-hole 45, the second point P2 being nearest to the first point P1; the outermost circumference first through-hole 39 has a first wall 39a which is a wall on a side of the second point P2, in a first cross-section that is a plane which includes the first point P1 and the second point P2 and is parallel to a normal direction N of the mask body 30; the outermost circumference first through-hole 39 has a first surface side connection part 39a1 which connects the first wall 39a and the first surface 30a, in the first cross-section; the first wall 39a does not have a part nearer to the first point P1 than the first surface side connection part 39a1; and the support 40 is located on a second side which is an opposite side of a first side which is a center side of the second through-hole 45 in a plane direction of the support 40, with respect to a straight line L2 of straight lines passing the first surface side connection part 39a1 and a given point on the first wall 39a in the first cross-section, the straight line L2 having a smallest angle with respect to the normal direction N of the mask body 30.

Also according to such a deposition mask 20, it can be effectively prevented that the course of the deposition material 98, which moves, at the largest angle θ2 with respect to the normal direction N, toward the substrate to be deposited 92 exposed into the outermost circumference first through-hole 39, is interfered with by the support 40 so that the deposition material 98 cannot appropriately adhere to the substrate to be deposited 92. Namely, generation of shadow can be effectively prevented.

Figure 18:
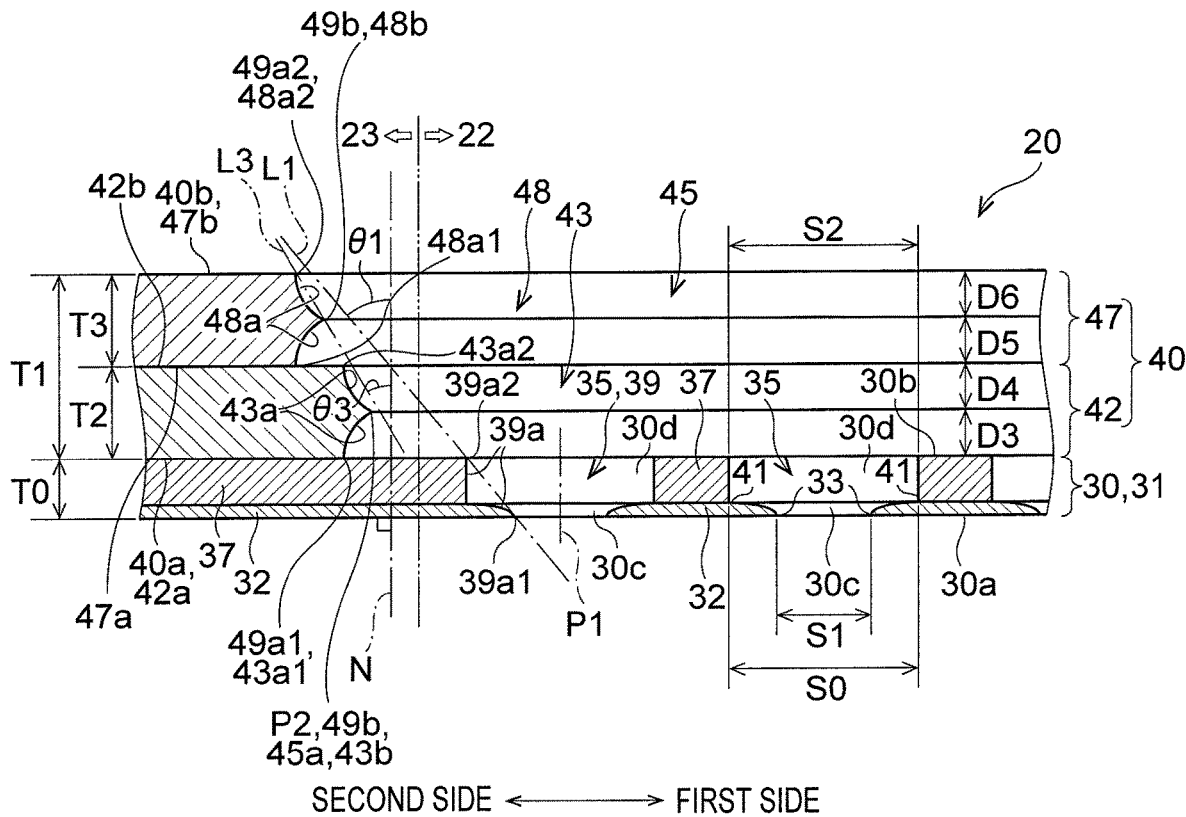
FIG. 18 is a cross-sectional view showing yet another modification example of the deposition mask.

FIG. 17 is a view corresponding to FIG. 8, which is a cross-sectional view showing another modification example of the deposition mask 20. FIG. 18 is a view corresponding to FIG. 8, which is a cross-sectional view showing yet another modification example of the deposition mask 20. In particular, FIGS. 17 and 18 show the deposition mask 20 in a first cross-section that is a plane which includes the first point P1 and the second point P2 and is parallel to the normal direction N of the mask body 30.

In the modification examples shown in FIGS. 17 and 18, the support 40 may include two or more layers. In particular, the support 40 may include a first layer 42 located on the mask body 30 side, and a second layer 47 located on the opposite side of the mask body 30. A plane of the first layer 42 and a plane of the second layer 47 may be parallel to each other. Thus, the normal direction of the support 40, the normal direction of the first layer 42 and the normal direction of the second layer 47 correspond to one another.

The first layer 42 may include a first surface 42a on the mask body 30 side and a second surface 42b on the second layer 47 side. In addition, the second layer 47 may have a first surface 74a on the first layer 42 side, and a second surface 47b located on the opposite side of the first layer 42. The second surface 42b of the first layer 42 and the first layer 47a of the second layer 47 may be in direct contact with each other. Alternatively, another layer may be disposed between the second surface 42b of the first layer 42 and the first layer 47a of the second layer 47.

The first layer 42 may have a third through-hole 43. The second layer 47 may have a fourth through-hole 48. Thus, the second through-hole 45 of the support 40 may include the third through-hole 43 and the fourth through-hole 48.

In the first cross-section shown in FIGS. 17 and 18, the third through-hole 43 of the first layer 42 may include a third wall 43a nearest to the outermost circumference first through-hole 39. The third wall 43a may have an apex 43b projecting to the first side. The third wall 43a may be inclined with respect to both the plane direction of the first layer 42 and the normal direction N thereof, such that the third wall 43a separates away from the outermost circumference first through-hole 39 in the plane direction of the first layer 42 (the right and left direction in FIG. 17), i.e., toward the second side, as it come close to the first surface 42a from the apex 43b. In addition, the third wall 43a may be inclined with respect to both the plane direction of the first layer 42 and the normal direction N thereof, such that the third wall 43a separates away from the outermost circumference first through-hole 39 in the plane direction of the first layer 42, i.e., toward the second side, as it comes close to the second surface 42b from the apex 43b.

In the first cross-section, the third through-hole 43 may have a first surface side connection part 43a1 that connects the third wall 43a and the first surface 42a. When a clear apex is found at a part where the third wall 43a and the first surface 42a are connected, the apex may be regarded as the first surface side connection part 43a1. On the other hand, when no clear apex is found at a part where the third wall 43a and the first surface 42a are connected, a part of the third wall 43a, which is distant from the first surface 42a along the thickness direction (normal direction) of the first layer 42 by 5% of the dimension of the thickness of the first layer 42, may be regarded as the first surface side connection part 43a1.

In the first cross-section, the third through-hole 43 may have a second surface side connection part 43a2 that connects the third wall 43a and the second surface 42b. When a clear apex is found at a part where the third wall 43a and the second surface 42b are connected, the apex may be regarded as the second surface side connection part 43a2. On the other hand, when no clear apex is found at a part where the third wall 43a and the second surface 42b are connected, a part of the third wall 43a, which is distant from the second surface 42b along the thickness direction (normal direction) of the first layer 42 by 5% of the dimension of the thickness of the first layer 42, may be regarded as the second surface side connection part 43a2.

The fourth through-hole 48 of the second layer 47 may include a fourth wall 48a nearest to the outermost circumference first through-hole 39. Thus, the second wall 49a of the support 40 may include the third wall 43a and the fourth wall 48a. The fourth wall 48a may have an apex 48b projecting to the first side. The fourth wall 48a may be inclined with respect to both the plane direction of the second layer 47 and the normal direction N thereof, such that the fourth wall 48a separates away from the outermost circumference first through-hole 39 in the plane direction of the second layer 47, i.e., toward the second side, as it comes close to the first surface 47a from the apex 48b. In addition, the fourth wall 48a may be inclined with respect to both the plane direction of the second layer 47 and the normal direction N thereof, such that the fourth wall 48a separates away from the outermost circumference first through-hole 39 in the plane direction of the second layer 47, i.e., toward the second side, as it comes close to the second surface 47b from the apex 48b.

In the first cross-section, the fourth through-hole 48 may have a first surface side connection part 48a1 that connects the fourth wall 48a and the first surface 47a. When a clear apex is found at a part where the fourth wall 48a and the first surface 47a are connected, the apex may be regarded as the first surface side connection part 48a1. On the other hand, when no clear apex is found at a part where the fourth wall 48a and the first surface 47a are connected, a part of the fourth wall 48a, which is distant from the first surface 47a along the thickness direction (normal direction) of the second layer 47 by 5% of the dimension of the thickness of the second layer 47, may be regarded as the first surface side connection part 48a1.

In the first cross-section, the fourth through-hole 48 may have a second surface side connection part 48a1 that connects the fourth wall 48a and the second surface 47b. When a clear apex is found at a part where the fourth wall 48a and the second surface 47b are connected, the apex may be regarded as the second surface side connection part 48a2. On the other hand, when no clear apex is found at a part where the fourth wall 48a and the first surface 47a are connected, a part of the fourth wall 48a, which is distant from the second surface 47b along the thickness direction (normal direction) of the second layer 47 by 5% of the dimension of the thickness of the second layer 47, may be regarded as second surface side connection part 48a2.

In the first cross-section, a distance between the apex 43b and the first surface side connection part 43a1 along the plane direction of the first layer 42 and a distance between the apex 43b and the second surface side connection part 43a1 along the plane direction of the first layer 42 may be equal to each other. In addition, a distance between the apex 48b and the first surface side connection part 48a1 along the plane direction of the second layer 47 and a distance between the apex 48b and the second surface side connection part 48a2 along the plane direction of the second layer 47 may be equal to each other.

In the first cross-section, a distance D3 between the apex 43b of the first layer 42 and the first surface 42a of the first layer 42 along the normal direction N of the support 40, and a distance D4 between the apex 43b of the first layer 42 and the second surface 42b of the first layer 42 along the normal direction N of the support 40 may be equal to each other. In addition, in the first cross-section shown in FIGS. 17 and 18, a distance D5 between the apex 48b of the second layer 47 and the first surface 47a of the second layer 47 along the normal direction N of the support 40, and a distance D6 between the apex 48b of the second layer 47 and the second surface 47b of the second layer 47 along the normal direction N of the support 40 may be equal to each other.

The first layer 47 and the second layer 47 may be produced, in the step of forming a resist film on the metal plate 64, which is described with reference to FIG. 11A, such that a pattern in a plan view of a first surface side resist pattern 65a formed on the first surface 64a of the metal plate 64, and a pattern in a plan view of a second surface side resist pattern 65b formed on the second surface 64b of the metal plate 64 are patterns equal to each other.

When the support 40 includes two or more layers, a thickness of each layer (e.g., the first layer 42 and the second layer 47) constituting the support 40 can be made smaller. In this case, in each layer constituting the support 40, an etching step for forming a through-hole (e.g., the third through-hole 43 and the fourth through-hole 48) can be performed in a short period of time. Thus, productivity upon manufacture of the support 40 can be improved.

A material of the first layer 42 and a material of the second layer 47 may respectively be materials similar to the aforementioned material of the support 40. The material of the first layer 42 and the material of the second layer 47 may include materials which are the same with each other. In particular, the material of the first layer 42 and the material of the second layer 47 may be the same with each other. However, not limited thereto, the material of the first layer 42 and the material of the second layer 47 may include materials that are different from each other.

As shown in FIG. 17, a distance between the apex 43b of the first layer 42 and the first point P1 along the plane direction of the support 40 may be equal to a distance between the apex 48b of the second layer 47 and the first point P1 along the plane direction of the support 40. In this case, in a plan view, the apexes 43b and 48b may form an outline 45a of the second through-hole 45 of the support 40. According to the support body having such a first layer 42 and such a second layer 47, the support 40 can be produced by stacking the first layer 42 and the second layer 47 having the same shape with each other, whereby a step of producing the support 40 can be simplified.

In addition, as shown in FIG. 18, a distance between the apex 43b of the first layer 42 and the first point P1 along the plane direction of the support 40 may be smaller than a distance between the apex 48b of the second layer 47 and the first point P1 along the plane direction of the support 40.

According to the support 40 having such a first layer 42 and such a second layer 47, while the opening area of the second through-hole 45 on the second surface 40b side can be enlarged, the thickness of the support 40 can be sufficiently ensured at a part near the outermost circumference first through-hole 39. Thus, while preventing generation of shadow, the mask body 30 can be appropriately supported by the support 40, so that generation of a space between the mask body 30 and the substrate to be deposited 92 can be prevented.

A thickness T2 of the first layer 42 may be equal to a thickness T2 of the second layer 47. In this case, the first layer 42 and the second layer 47 can be manufactured from metal plates having the same thickness, whereby steps of producing the first layer 42 and the second layer 47 can be simplified. However, not limited thereto, the thickness T2 of the first layer 42 may be smaller than the thickness T3 of the second layer 47. Alternatively, the thickness T2 of the first layer 42 may be larger than the thickness T3 of the second layer 47.

In the modification example described with reference to FIGS. 17 and 18, the support 40 may have fixing means that fix the first layer 42 and a second layer 47 to each other. For example, the support 40 may have an adhesive layer positioned between the first layer 42 and the second layer 47. Specifically, the support 40 may have an adhesive layer for fixing the first layer 42 and the second layer 47 to each other, between the second surface 42b of the first layer 42 and the first surface 47a of the second layer 47.

In addition, the support 40 may have a plated layer positioned across the surface of the first layer 42 and the surface of the second layer 47. For example, the support 40 may have a plated layer positioned across at least a part of the surface of the first layer 42, and at least a part of the surface of the second layer 47. To be more specific, the support 40 may have a plated layer positioned across at least a part of the third wall 43a of the first layer 42, and at least a part of the surface of the fourth wall 48a of the second layer 47.

In addition, the support 40 may have an adhesive layer positioned between the first layer 42 and the second layer 47, and a plated layer positioned across the surface of the first layer 42 and the surface of the second layer 47. For example, the support 40 may include an adhesive layer positioned between the first layer 42 and the second layer 47, and a plated layer positioned across at least a part of third wall 43a of the first layer 42 and at least a part of the fourth wall 48a of the second layer 47.

In the support 40 having such fixing means, since the first layer 42 and the second layer 47 are fixed to each other, strength of the support 40 can be improved. Thus, the mask body 30 can be more appropriately supported by the support 40.

Figure 19:
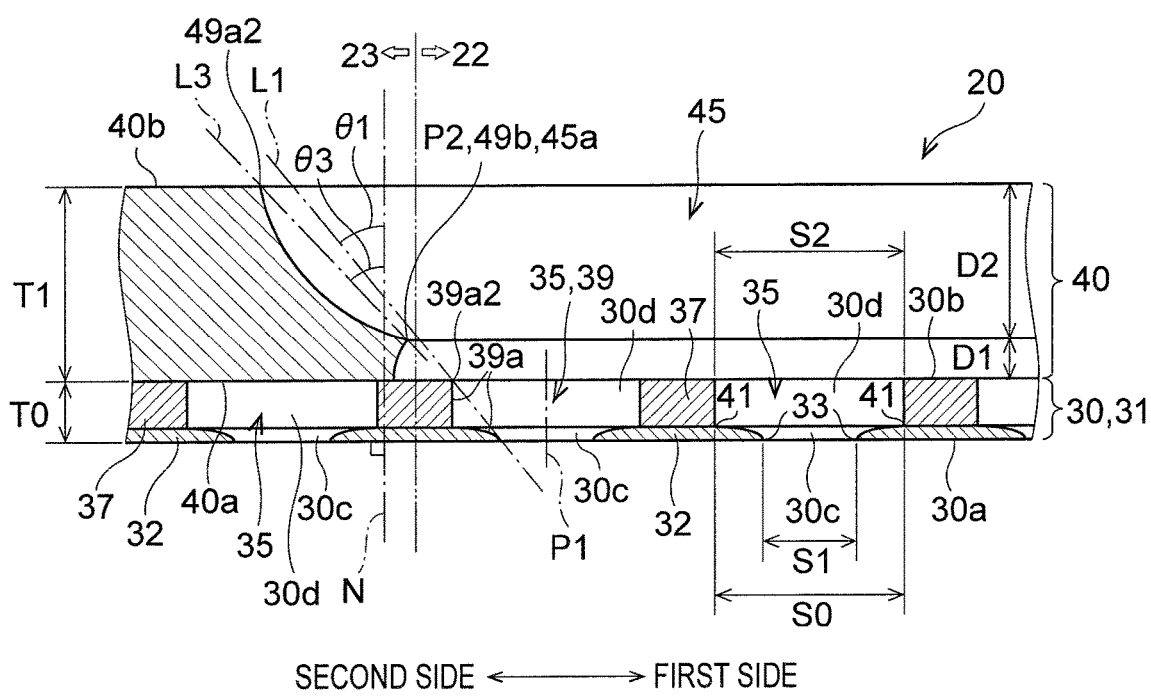
FIG. 19 is a cross-sectional view showing yet another modification example of the deposition mask.

FIG. 19 is a view corresponding to FIG. 18, which is a cross-sectional view showing yet another modification example of the deposition mask 20. In particular, FIG. 19 shows the deposition mask 20 in a first cross-section that is a plane which includes the first point P1 and the second point P2 and is parallel to the normal direction N of the mask body 30.

As shown in FIG. 19, the support 40 may cover one or more first through-hole(s) 35 of two or first through-holes 35 of the mask body 30. No deposition material 98 passes through the first through-hole 35 covered with the support 40, in the deposition step. In this case, regardless of an arrangement pattern of the first through-holes 35 in the mask body 30, a shape corresponding to the outline 45a of the second through-hole 45 of the support 40 can be given to an outline of a display area of the substrate to be deposited (substrate for organic EL) 92.

What is claimed is:

1. A deposition mask comprising:
  a mask body having two or more first through-holes; and
  a support disposed on the mask body and having a second through-hole located at a position overlapped with the first through-holes in a plan view,
  wherein the mask body has a first surface and a second surface opposite to the first surface, the second surface being closer to the support than the first surface,
  wherein the support has a first surface and a second surface opposite the first surface, the first surface being closer to the mask body than the second surface,
  wherein an outermost circumference first through-hole located, on an outermost circumference in the plan view, includes a first point in a center of the outermost circumference first through-hole in the plan view,
  wherein the second through-hole includes a second point on an outline of the second through-hole, and among all points along the outline of the second through-hole, the second point being nearest to the first point,
  wherein a first wall is provided on a side of the outermost circumference first through-hole that is closest to the second point and is parallel to a normal direction of the mask body, in a first cross-section that includes the first and second points,
  wherein the outermost circumference first through-hole has a second surface side connection part which connects the first wall and the second surface of the mask body, in the first cross-section,
  wherein, in the first cross-section, the support is located on a second side with respect to a first straight line, the second side being opposite to a first side, the first side being a center side of the second through-hole, the first straight line being one of a plurality of straight lines passing the second surface side connection part and given points on the first wall, the first straight line forming two angles with respect to the normal direction of the mask body, wherein a smaller angle of the two angles is a largest angle among a plurality of smaller angles formed by the plurality of straight lines,
  wherein the second through-hole has a second wall nearest to the outermost circumference first through-hole, the second wall having an apex,
  wherein the second wall is inclined with respect to the normal direction of the support, such that the second wall separates away from the outermost circumference first through-hole, as the second wall comes close to the first surface of the support from the apex, and
  wherein the second wall is inclined with respect to the normal direction of the support, such that the second wall separates away from the outermost circumference first through-hole, as the second wall comes close to the second surface of the support from the apex.

2. The deposition mask according to claim 1, wherein the second through-hole has a second surface side connection part that connects the second wall and the second surface of the support, in the first cross-section, and
  wherein, in the first cross-section, a third straight line, which is one of the plurality of straight lines passing the second surface side connection part of the second through-hole and given points on the second wall, forms two angles with respect to the normal direction of the support, wherein a smaller angle of the two angles is a largest angle among the smaller angles formed by the plurality of straight lines, and wherein the largest angle among the smaller angles is in a range of 20° to 60°.

3. The deposition mask according to claim 1, wherein the support has a thickness not less than 0.05 mm and not more than 3 mm.

4. The deposition mask according to claim 1, wherein the mask body contains metal.

5. The deposition mask according to claim 1, wherein the support contains metal.

6. The deposition mask according to claim 1, wherein the mask body and the support contain metal.

7. The deposition mask according to claim 1, wherein a distance between the second point and the first surface of the support along the normal direction of the support is smaller than a distance between the second point and the second surface of the support along the normal direction of the support.

8. The deposition mask according to claim 1, wherein the second through-hole has a first surface side connection part that connects the second wall and the first surface of the support, and a second surface side connection part that connects the second wall and the second surface of the support, and
wherein the second surface side connection part of the second through-hole is located on the second side, with respect to the first surface side connection part of the second through-hole.

9. The deposition mask according to claim 1, wherein the support includes two or more layers.

10. The deposition mask according to claim 9, wherein the support has a first layer and a second layer, the first layer being closer to the mask body than the second layer.

11. The deposition mask according to claim 10, wherein a thickness of the first layer is smaller than a thickness of the second layer.

12. The deposition mask according to claim 10, wherein a thickness of the first layer is larger than a thickness of the second layer.

13. The deposition mask according to claim 10, wherein a thickness of the first layer is equal to a thickness of the second layer.

14. A deposition mask comprising:
a mask body having two or more first through-holes; and
a support disposed on the mask body and having a second through-hole located at a position overlapped with the first through-holes in a plan view;
wherein the mask body has a first surface and a second surface opposite to the first surface, the second surface being closer to the support than the first surface,
wherein the support has a first surface and a second surface opposite to the first surface, the first surface being closer to the mask body than the second surface,
wherein an outermost circumference first through-hole, located on an outermost circumference in the plan view, includes a first point in a center of the outermost circumference first through-hole in the plan view,
wherein the second through-hole includes a second point on an outline of the second through-hole, and among all points along the outline of the second through-hole, the second point being nearest to the first point,
wherein a first wall is provided on a side of the outermost circumference first through-hole that is closest to the second point is parallel to a normal direction of the mask body, in a first cross-section that includes the first and second points,
wherein the outermost circumference first through-hole has a first surface side connection part which connects the first wall and the first surface of the mask body, in the first cross-section,
wherein no part of the first wall is nearer to the first point than the first surface side connection part,
wherein, in the first cross-section, the support is located on a second side with respect to a second straight line, the second side being opposite to a first side, the first side being a center side of the second through-hole, the second straight line being one of a plurality of straight lines passing the first surface side connection part and given points on the first wall, the second straight line forming two angles with respect to the normal direction of the mask body, wherein a smaller angle of the two angles is a smallest angle among a plurality of smaller angles formed by the plurality of straight lines,
the second through-hole has a second wall nearest the outermost circumference first through-hole, the second wall having an apex,
the second wall is inclined with respect to the normal direction of the support, such that the second wall separates away from the outermost circumference first through-hole, as the second wall comes close to the first surface of the support from the apex, and
the second wall is inclined with respect to the normal direction of the support, such that the second wall separates away from the outermost circumference first through-hole, as the second wall comes close to the second surface of the support from the apex.

* * * * *